(12) United States Patent
Nagasaka

(10) Patent No.: US 8,570,484 B2
(45) Date of Patent: Oct. 29, 2013

(54) IMMERSION EXPOSURE APPARATUS, DEVICE MANUFACTURING METHOD, CLEANING METHOD, AND CLEANING MEMBER TO REMOVE FOREIGN SUBSTANCE USING LIQUID

(75) Inventor: Hiroyuki Nagasaka, Kumagaya (JP)

(73) Assignee: Nikon Corporation, Tokyo (JP)

( * ) Notice: Subject to any disclaimer, the term of this patent is extended or adjusted under 35 U.S.C. 154(b) by 319 days.

(21) Appl. No.: 11/892,944

(22) Filed: Aug. 28, 2007

(65) Prior Publication Data

US 2008/0055575 A1 Mar. 6, 2008

(30) Foreign Application Priority Data

Aug. 30, 2006 (JP) ................................. 2006-234006

(51) Int. Cl.
 *G03B 27/52* (2006.01)
(52) U.S. Cl.
 USPC ............................................................ 355/30
(58) Field of Classification Search
 USPC ...................................... 355/30, 53
 See application file for complete search history.

(56) References Cited

U.S. PATENT DOCUMENTS

| | | | |
|---|---|---|---|
| 4,346,164 A | 8/1982 | Tabarelli et al. | |
| 4,480,910 A | 11/1984 | Takanashi et al. | |
| 5,493,403 A | 2/1996 | Nishi | |
| 5,610,683 A | 3/1997 | Takahashi | |
| 5,715,039 A | 2/1998 | Fukuda et al. | |
| 5,825,043 A | 10/1998 | Suwa | |
| 5,969,441 A | 10/1999 | Loopstra et al. | |
| 6,341,007 B1 | 1/2002 | Nishi et al. | |
| 6,400,441 B1 | 6/2002 | Nishi et al. | |
| 6,496,257 B1 | 12/2002 | Taniguchi et al. | |
| 6,549,269 B1 | 4/2003 | Nishi et al. | |
| 6,590,634 B1 | 7/2003 | Nishi et al. | |
| 6,611,316 B2 | 8/2003 | Sewell | |
| 6,778,257 B2 | 8/2004 | Bleeker et al. | |

(Continued)

FOREIGN PATENT DOCUMENTS

DE 221563 A1 9/1983
DE 224448 A1 7/1985

(Continued)

OTHER PUBLICATIONS

International Search Report issued on the counterpart PCT Patent Application No. PCT/JP2007/066673 on Dec. 11, 2007 (with translation).

(Continued)

*Primary Examiner* — Toan Ton
*Assistant Examiner* — Chia-how Michael Liu
(74) *Attorney, Agent, or Firm* — Oliff & Berridge, PLC

(57) ABSTRACT

A liquid immersion exposure apparatus that exposes a substrate with exposure light and a cleaning method of the liquid immersion exposure apparatus includes holding a plate member by a holding section of a substrate stage that can hold the substrate, confining a liquid between a first member and the plate member, thereby a liquid immersion area is formed on a portion of an upper surface of the plate member, the portion being less than the upper surface, varying at least one of a supply rate and a recovery rate of the liquid to move an interface of the liquid between the first member and the plate member, thereby removing a foreign substance from the first member, and unloading the plate member from the substrate stage.

18 Claims, 22 Drawing Sheets

(56) References Cited

U.S. PATENT DOCUMENTS

| | | |
|---|---|---|
| 6,897,963 B1 | 5/2005 | Taniguchi et al. |
| 2004/0160582 A1 | 8/2004 | Lof et al. |
| 2004/0165159 A1 | 8/2004 | Lof et al. |
| 2005/0024609 A1 | 2/2005 | De Smit et al. |
| 2005/0205108 A1 | 9/2005 | Chang et al. |
| 2005/0274898 A1 | 12/2005 | Watanabe et al. |
| 2006/0028626 A1 | 2/2006 | Chang et al. |
| 2006/0028628 A1 | 2/2006 | Lin et al. |
| 2006/0050351 A1 | 3/2006 | Higashiki |
| 2006/0077367 A1 | 4/2006 | Kobayashi et al. |
| 2006/0132731 A1 | 6/2006 | Jansen et al. |
| 2006/0177777 A1 | 8/2006 | Kawamura et al. |
| 2006/0250588 A1 | 11/2006 | Brandl |
| 2007/0091287 A1 | 4/2007 | Chang et al. |
| 2007/0127006 A1 | 6/2007 | Shibazaki |
| 2009/0225286 A1 * | 9/2009 | Nagasaka et al. ............... 355/30 |

FOREIGN PATENT DOCUMENTS

| | | |
|---|---|---|
| EP | 1586386 A1 | 10/2005 |
| EP | 1628329 A1 | 2/2006 |
| EP | 1 667 211 A1 | 6/2006 |
| EP | 1 713 113 A1 | 10/2006 |
| EP | 1 783 821 A1 | 5/2007 |
| EP | 1 783 822 A1 | 5/2007 |
| EP | 1 791 164 A1 | 5/2007 |
| EP | 1783821 A1 | 5/2007 |
| EP | 1791164 A1 | 5/2007 |
| EP | 1 814 144 A1 | 8/2007 |
| EP | 1 821 337 A1 | 8/2007 |
| EP | 1 821 338 A1 | 8/2007 |
| JP | A-58-202448 | 11/1983 |
| JP | A-59-019912 | 2/1984 |
| JP | A-62-065326 | 3/1987 |
| JP | A-63-157419 | 6/1988 |
| JP | A-04-065603 | 3/1992 |
| JP | A-04-305915 | 10/1992 |
| JP | A-04-305917 | 10/1992 |
| JP | A-05-062877 | 3/1993 |
| JP | A-06-124873 | 5/1994 |
| JP | A-07-220990 | 8/1995 |
| JP | A-08-316125 | 11/1996 |
| JP | A-09-298148 | 11/1997 |
| JP | A-10-163099 | 6/1998 |
| JP | A-10-214783 | 8/1998 |
| JP | A-10-303114 | 11/1998 |
| JP | A-10-340846 | 12/1998 |
| JP | A-11-135400 | 5/1999 |
| JP | A-11-162831 | 6/1999 |
| JP | A-11-176727 | 7/1999 |
| JP | A-2000-058436 | 2/2000 |
| JP | A-2000-505958 | 5/2000 |
| JP | A-2000-164504 | 6/2000 |
| JP | A-2004-519850 | 7/2004 |
| JP | A-2004-289127 | 10/2004 |
| JP | A-2006-32750 | 2/2006 |
| JP | A-2006-73951 | 3/2006 |
| JP | A-2006-156974 | 6/2006 |
| JP | A-2006-165502 | 6/2006 |
| JP | A-2006-190997 | 7/2006 |
| JP | A-2006-222284 | 8/2006 |
| JP | A-2006-523031 | 10/2006 |
| WO | WO 99/49504 A1 | 9/1999 |
| WO | WO 01/35168 A1 | 5/2001 |
| WO | WO 02/069049 A2 | 9/2002 |
| WO | WO 2004/019128 A2 | 3/2004 |
| WO | WO 2004/050266 A1 | 6/2004 |
| WO | WO 2004/093130 A2 | 10/2004 |
| WO | WO 2004/105107 A1 | 12/2004 |
| WO | WO 2005/031820 A1 | 4/2005 |
| WO | WO 2005/059618 A2 | 6/2005 |
| WO | WO 2005/074014 A1 | 8/2005 |
| WO | WO 2005/122218 A1 | 12/2005 |
| WO | WO 2005/124833 * | 12/2005 |
| WO | WO 2005/124833 A1 | 12/2005 |
| WO | WO 2006/013806 A1 | 2/2006 |
| WO | WO 2006/062065 A1 | 6/2006 |

OTHER PUBLICATIONS

Written Opinion issued on the counterpart PCT Patent Application No. PCT/JP2007/066673 on Dec. 11, 2007 (with translation).

A complete English language translation of JP-A-2006-32750 previously cited Jan. 11, 2008.

Japanese Office Action dated Aug. 7, 2012 issued in JP-2008-532073 (with English Translation).

* cited by examiner

IMMERSION EXPOSURE APPARATUS, DEVICE MANUFACTURING METHOD, CLEANING METHOD, AND CLEANING MEMBER TO REMOVE FOREIGN SUBSTANCE USING LIQUID

CROSS-REFERENCE TO RELATED APPLICATION

Priority is claimed on Japanese Patent Application No. 2006-234006, filed on Aug. 30, 2006, the contents of which are incorporated herein by reference.

BACKGROUND

1. Field of the Invention

The present invention relates to an exposure apparatus for exposing a substrate and a device manufacturing method, and a cleaning method and a cleaning member for the exposure apparatus.

2. Description of Related Art

In exposure apparatus used in the photolithography process, liquid immersion exposure apparatuses that form a liquid immersion space where an optical path space for exposure light is filled with liquid, and expose a substrate via this liquid, as disclosed in PCT International Publication No. WO99/49504, and Japanese Unexamined Patent Application, First Publication No. 2004-289127.

In a liquid immersion exposure apparatus, there is a possibility of contamination on a member that comes in contact with the liquid, and if the contaminated member is left in the contaminated state, the contamination expands and the performance of the exposure apparatus deteriorates. As a result, the liquid immersion exposure apparatus may become unable to expose a substrate well.

A purpose of some aspects of the invention is to provide an exposure apparatus able to suppress deterioration in performance caused by contamination, and a device manufacturing method that uses this exposure apparatus. Another purpose is to provide a cleaning method and a cleaning member for cleaning the exposure apparatus well, in order to suppress deterioration in the performance of the exposure apparatus caused by contamination

SUMMARY

A first aspect of the present invention provides an exposure apparatus that exposes a substrate with exposure light, comprising: a first member that can form liquid immersion with a first liquid so as to fill an optical path for the exposure light with the first liquid; a second member that is disposed apart form the first member and between which and a predetermined member can be formed liquid immersion with a second liquid; and a vibration generator that imparts vibration to the second liquid between the second member and the predetermined member.

According to the first aspect of the present invention, deterioration in performance caused by contamination can be suppressed.

A second aspect of the present invention provides an exposure apparatus that exposes a substrate with exposure light via a liquid, comprising: a flexible member, a driving device that moves the flexible member, an observation device that is provided on a distal end side of the flexible member, and that enables observation of a contamination status of a predetermined member having been in contact with the liquid; and an output device that is provided on a base end side of the flexible member, and that outputs an observation result from the observation device.

According to the second aspect of the present invention, deterioration in performance caused by contamination can be suppressed.

A third aspect of the present invention provides an exposure apparatus that exposes a substrate with exposure light via a first liquid, comprising: an optical element through which the exposure light transmits; a predetermined member which is movable at a light emitting side of the optical element; and a vibration generator that imparts vibration to a liquid on the predetermined member, by vibrating the predetermined member.

According to the third aspect of the present invention, deterioration in performance caused by contamination can be suppressed.

A fourth aspect of the present invention provides a device manufacturing method that uses the exposure apparatus of the above aspects.

According to the fourth aspect of the present invention, a device can be manufactured using an exposure apparatus that suppresses deterioration in performance.

A fifth aspect of the present invention provides a method for cleaning a predetermined member of an exposure apparatus that exposes a substrate with exposure light via a first liquid, the method comprising: forming liquid immersion with a second liquid on the predetermined member in a position distanced from an optical path of the exposure light; and imparting vibration to the second liquid on the predetermined member to clean the predetermined member.

According to the fifth aspect of the present invention, deterioration in performance of the exposure apparatus caused by contamination can be suppressed.

A sixth aspect of the present invention provides a method for cleaning a predetermined member of an exposure apparatus that exposes a substrate with exposure light via a first liquid, the method comprising: observing the predetermined member using an observation device provided on a distal end side of a flexible member; and cleaning the predetermined member by operating a cleaning device using an operating device based on the observation result, the cleaning device being provided on a distal end side of the flexible member, the operating device being provided on a base end side of the flexible member.

According to the sixth aspect of the present invention, deterioration in performance of the exposure apparatus caused by contamination can be suppressed.

A seventh aspect of the present invention provides a cleaning method of a liquid immersion exposure apparatus that exposes a substrate with exposure light, the method comprising: holding a plate member by a holding section of a substrate stage that can hold the substrate, and forming liquid immersion of a liquid between a first member and the plate member; moving an interface of the liquid between the first member and the plate member to remove a foreign substance attached to the first member from the first member; and unloading the plate member from the substrate stage.

According to the seventh aspect of the present invention, deterioration in performance of the exposure apparatus caused by contamination can be suppressed.

An eighth aspect of the present invention provides a cleaning method of a liquid immersion exposure apparatus that exposes a substrate with exposure light, the method comprising: forming liquid immersion on the predetermined member that is movable at a light emitting side of an optical element through which the exposure light transmits; and imparting vibration to a liquid on the predetermined member by vibrating the predetermined member.

According to the eighth aspect of the present invention, deterioration in performance of the exposure apparatus caused by contamination can be suppressed.

A ninth aspect of the present invention provides a cleaning member that is detachably held by a holding section of a substrate stage that can hold a substrate onto which exposure light is irradiated and that is used for cleaning a first member, comprising: a face between which and the predetermined member is formed liquid immersion of a liquid, wherein the face can hold a foreign substance that has been removed from the first member by a cleaning operation using the liquid.

According to the ninth aspect of the present invention, the exposure apparatus can be cleaned well, and deterioration in performance of the exposure apparatus caused by contamination can be suppressed.

According to the present invention, deterioration in performance of the exposure apparatus caused by contamination can be suppressed and a substrate can be exposed well.

DETAILED DESCRIPTION OF THE INVENTION

Hereunder is a description of embodiments of the present invention with reference to the drawings. However, the present invention is not limited to this description. In the following description, an XYZ rectangular coordinate system is established, and the positional relationship of respective members is described with reference to this XYZ rectangular co-ordinate system. A predetermined direction within a horizontal plane is made the X axis direction, a direction orthogonal to the X axis direction within the horizontal plane is made the Y axis direction, and a direction orthogonal to both the X axis direction and the Y axis direction (that is, a perpendicular direction) is made the Z axis direction. Furthermore, rotation (inclination) directions about the X axis, the Y axis and the Z axis, are made the θX the θY, and the θZ directions respectively.

<First Embodiment>

Figure 1:
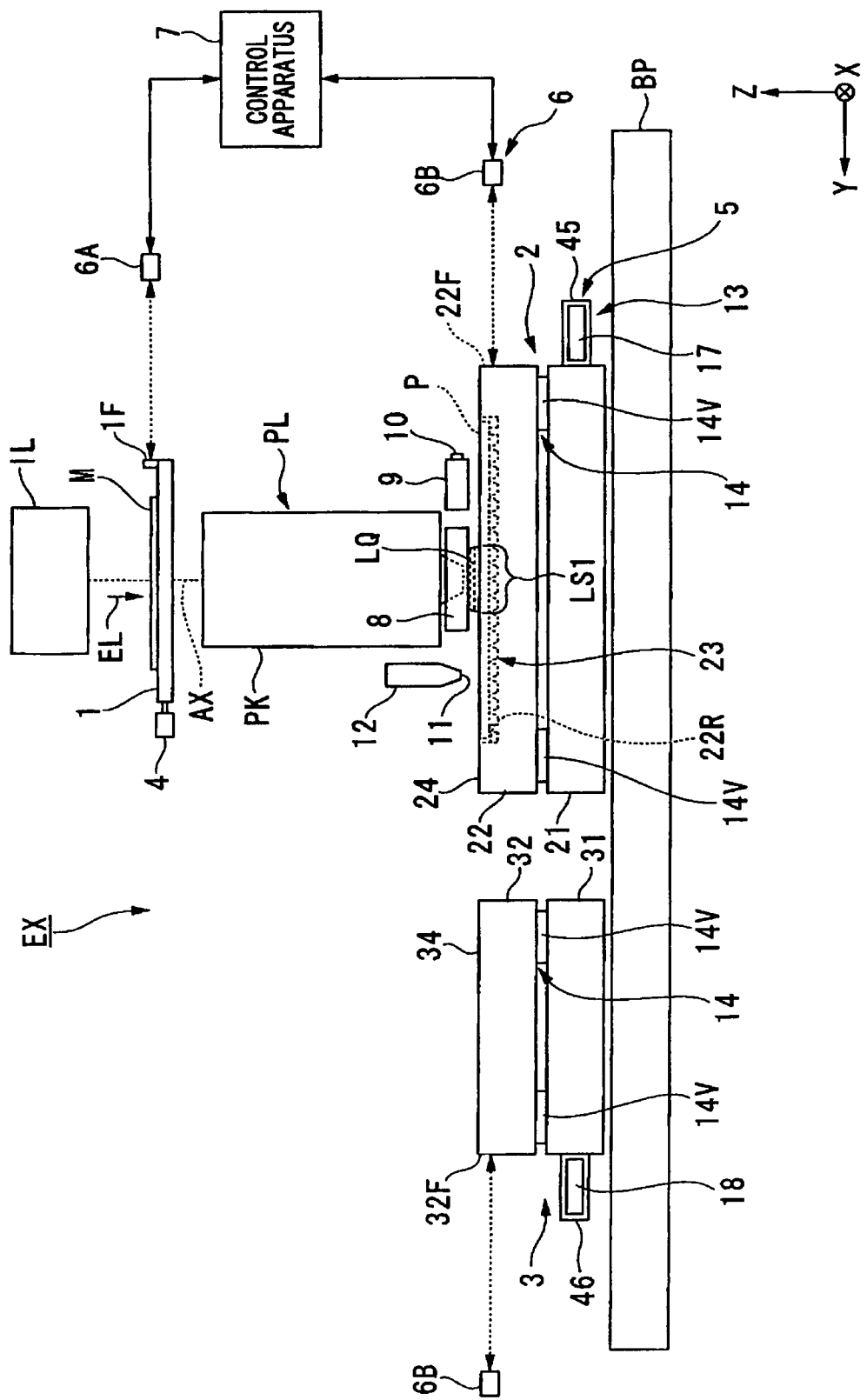
FIG. 1 is a schematic block diagram showing an exposure apparatus according to a first embodiment.

Hereunder, a first embodiment is described. FIG. 1 is a schematic block diagram showing an exposure apparatus EX according to the first embodiment. In FIG. 1, the exposure apparatus EX is provided with: a mask stage 1 which is movable while holding a mask M; a substrate stage 2 which is movable while holding a substrate P; a measurement stage 3 that does not hold the substrate P and that has a measurement instrument that is able to execute exposure-related measurement mounted thereon and which is movable independently from the substrate stage 2; a driving mechanism 4 that moves the mask stage 1; a driving mechanism 5 that moves the substrate stage 2 and the measurement stage 3; a measurement system 6 including a laser interferometer that measures positional information of the respective stages; an illumination system IL that illuminates the mask M with exposure light EL; a projection optical system PL that projects a pattern image of the mask M illuminated by the exposure light EL onto the substrate P; and a control device 7 that controls operation of the entire exposure apparatus EX.

The substrate P here is an exposure substrate for fabricating a device, and includes a substrate of a semiconductor wafer or the like, such as a silicon wafer, having a film of a photosensitive material (photoresist) or the like formed thereon, or having various types of membrane such as a protective membrane (top coat membrane) other than a photosensitive membrane coated thereon. The substrate P is a disk shaped member. The mask M includes a reticle formed with a device pattern to be projected onto the substrate P. In the present embodiment, a transmission mask is used as the mask, however a reflecting mask may be used. The transmission type mask is not limited to a binary mask on which the pattern is formed by a light shielding membrane, and includes, for example, a half tone type or a phase shift mask such as a spatial frequency modulation type.

The exposure apparatus EX of the present embodiment is a liquid immersion exposure apparatus that employs a liquid immersion method in order to improve resolution and to substantially widen the focal depth by substantially shortening the exposure wavelength, and it is provided with a first nozzle member 8 that can form a first liquid immersion space LS1 with exposure liquid LQ (hereinafter, referred to as first liquid LQ) so as to fill the optical path space for the exposure light EL with the first liquid LQ. The exposure apparatus EX exposes the substrate P by irradiating the exposure light EL onto the substrate P via the first liquid LQ.

Moreover, the exposure apparatus EX of the present embodiment is provided with: a second nozzle member 9 that can form a second liquid immersion space LS2 with cleaning liquid LC (hereinafter, referred to as second liquid LC), in a position distanced from the first nozzle member 8; and an ultrasonic wave generator 10 that imparts ultrasonic waves (vibration) to the second liquid LC of the second liquid immersion space LS2.

Furthermore, the exposure apparatus EX of the present embodiment is provided with a third nozzle member 12 having a gas supply port 11 able to supply gas, in a position distanced from the first nozzle member 8 and the second nozzle member 9.

The optical path space for the exposure light EL is a space including an optical path along which the exposure light EL travels. The liquid immersion space is a space filled with liquid.

The first nozzle member 8 can form the first liquid immersion space LS1 between the first nozzle member 8 and an object opposing thereto. In the present embodiment, on the light emitting side (image plane side) of the projection optical system PL, the first nozzle member 8 can form the first liquid immersion space LS1 between the first nozzle member 8 and the surface of an object arranged in a position onto which the exposure light EL can be irradiated, that is, between the first nozzle member 8 and the surface of the object arranged in the position that opposes the light emitting side surface of the projection optical system PL. The first nozzle member 8 forms the first liquid immersion space LS1 of the first liquid LQ between the first nozzle member 8 and the surface of the object so as to fill the optical path space for the exposure light EL on the light emitting side of the projection optical system PL by holding the first liquid LQ between the first nozzle member 8 and the surface of the object with the first liquid LQ. Specifically, it forms the first liquid immersion space LS1 of the first liquid LQ between the first nozzle member 8 and the surface of the object so as to fill the optical path space for the exposure light EL between the projection optical system PL and the object, with the first liquid LQ.

The second nozzle member 9 can form the second liquid immersion space LS2 between the second nozzle member 9 and an object opposing thereto. The second nozzle member 9 forms the second liquid immersion space LS2 between the second nozzle member 9 and the surface of the object with the second liquid LC by holding the second liquid LC between the second nozzle member 9 and the surface of the object. The exposure apparatus EX forms the second liquid immersion space LS2 between the second nozzle member 9 and the object opposing thereto, and cleans the object using the second liquid LC.

In the present embodiment, the exposure apparatus EX forms the first liquid immersion space LS1 between the first nozzle member 8 and the object so that one portion of the region (local region) of the surface of the object is covered by the first liquid LQ. Moreover, the exposure apparatus EX forms the second liquid immersion space LS2 between the second nozzle member 9 and the object so that one portion of the region (local region) of the surface of the object is covered by the second liquid LC of the second liquid immersion space LS2.

The object that can oppose the first nozzle member 8 and the second nozzle member 9 includes an object that is movable at the light emitting side (image plane side) of the projection optical system PL. In the present embodiment, the object that can oppose the first nozzle member 8 and the second nozzle member 9 includes at least either one of the substrate stage 2 and the measurement stage 3 that are movable at the light emitting side of the projection optical system PL. Moreover, the object that can oppose the first nozzle member 8 and the second nozzle member 9 includes the substrate P held by the substrate stage 2.

The substrate stage 2 and the measurement stage 3 are able to move relatively with respect to the first nozzle member 8, the second nozzle member 9, and the third nozzle member 12, and the first nozzle member 8, the second nozzle member 9 and the third nozzle member 12 can respectively oppose the substrate stage 2 and the measurement stage 3. That is to say, the substrate stage 2 and the measurement stage 3 can be respectively arranged in positions that respectively oppose the first nozzle member 8, the second nozzle member 9, and the third nozzle member 12.

The exposure apparatus EX can form the first liquid immersion space LS1 with the first liquid LQ between the first nozzle member 8 and at least either one of the substrate stage 2 and the measurement stage 3, when at least either one of the substrate stage 2 and the measurement stage 3 opposes the first nozzle member 8.

Also in the present embodiment, the second nozzle member 9 can form the second liquid immersion space LS2 between the second nozzle member 9 and the surface of the object that is movable at the light emitting side of the projection optical system PL. The exposure apparatus EX can form the second liquid immersion space LS2 with the second liquid LC between the second nozzle member 9 and at least either one of the substrate stage 2 and the measurement stage 3, when at least either one of the substrate stage 2 and the measurement stage 3 opposes the second nozzle member 9.

Moreover, in the state of having formed the first liquid immersion space LS1, the exposure apparatus EX can relatively move the first nozzle member 8 and at least either one of the substrate stage 2 and the measurement stage 3 that opposes the first nozzle member 8, and in the state of having formed the second liquid immersion space LS2, the exposure apparatus EX can relatively move the second nozzle member 9 and at least either one of the substrate stage 2 and the measurement stage 3 that opposes the second nozzle member 9.

The illumination system IL illuminates a predetermined illumination region on the mask M with exposure light EL of a uniform luminance distribution. For the exposure light EL emitting from the illumination system IL, for example emission lines (g-ray, h-ray, i-ray), emitted from a mercury lamp, deep ultraviolet beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm), may be used. In this embodiment, the ArF excimer laser beam is used as the exposure light EL.

The mask stage 1 is moveable in the X axis, the Y axis, and the θZ directions while holding the mask M, by means of the driving mechanism 4 which includes an actuator such as a linear motor. Positional information of the mask stage 1 (and consequently the mask M) is measured by a laser interferometer 6A of the measurement system 6. The laser interferometer 6A uses a measurement mirror 1F which is provided on the mask stage 1 to measure the position information of the X axis, the Y axis, and the θZ directions of the mask stage 1. The control apparatus 7 drives the driving mechanism 4 based on the measured results of the measurement system 6, and controls the position of the mask M which is held on the mask stage 1.

The projection optical system PL projects a pattern image of the mask M onto the substrate P at a predetermined projection magnification. The projection optical system PL has a plurality of optical elements, and these optical elements are held in a lens barrel PK. The projection optical system PL is a reduction system with a projection magnification of for example ¼, ⅕, ⅛ or the like. The projection optical system PL may be a reduction system, an equal system or a magnification system. In the present embodiment, the optical axis AX of the projection optical system PL is parallel with the Z axis direction. Furthermore, the projection optical system PL may include any one of; a refractive system which does not include a reflection optical element, a reflection system which does not include a refractive optical element, or a cata-dioptric system which includes a reflection optical element and a refractive optical element Moreover, the projection optical system PL may form either an inverted image or an erect image.

The substrate stage 2 has a stage main-structure 21, and a substrate table 22 supported on the stage main-structure 21 and having a holding section 23 which detachably holds the substrate P. The stage main-structure 21 is supported on the top face (guide face) of the base member BP in a non contact manner by an air bearing. The substrate table 22 has a recessed portion 22R, and the holding section 23 is arranged in the recessed portion 22R. The top face 24 around the recessed portion 22R of the substrate table 22 is substantially flat, and substantially at the same height (flush) as the surface of the substrate P held by the holding section 23. The substrate stage 2 is movable by the driving mechanism 5 in directions of six degrees of freedom of the X axis, the Y axis, the Z axis, the θX, the θY, and the θZ directions, on the base member BP, while holding the subs P by the holding section 23.

The measurement stage 3 has a stage main-structure 31, and a measurement table 32 supported on the stage main-structure 31 and on which is mounted at least a part of a measuring instrument. The measuring instrument includes a reference member formed with a reference mark, and/or various types of optical sensors. The stage main-structure 31 is supported on the top face (guide face) of the base member BP in a non contact manner by an air bearing. The top face 34 of the measurement table 32 is substantially flat. The measurement stage 3 is movable by the driving mechanism 5 in directions of six degrees of from of the X axis, the Y axis, the Z axis, the θX, the θY, and the θZ directions, on the base member BP, with the measuring instrument mounted thereon.

The driving mechanism 5 includes an actuator such as a linear motor, and is capable of moving the respective substrate stage 2 and the measurement stage 3. The driving mechanism 5 includes a coarse movement system 13 which moves the respective stage main-structures 21 and 31 on the base member BP, and a fine movement system 14 which moves the respective tables 22 and 32 on the respective stage main-structures 21 and 31.

The coarse movement system 13 includes an actuator such as a linear motor, and is capable of moving the respective stage main-structures 21 and 31 on the base member BP in the X axis, the Y axis, and the θZ directions. The respective stage main-structures 21 and 31 are moved in the X axis, the Y axis, and the θZ directions by the coarse movement system 13, and thereby the respective substrate tables 22 and 32 mounted on the respective stage main-structures 21 and 31 are moved together with the respective stage main-structures 21 and 31 in the X axis, the Y axis, and the θZ directions.

Figure 2:
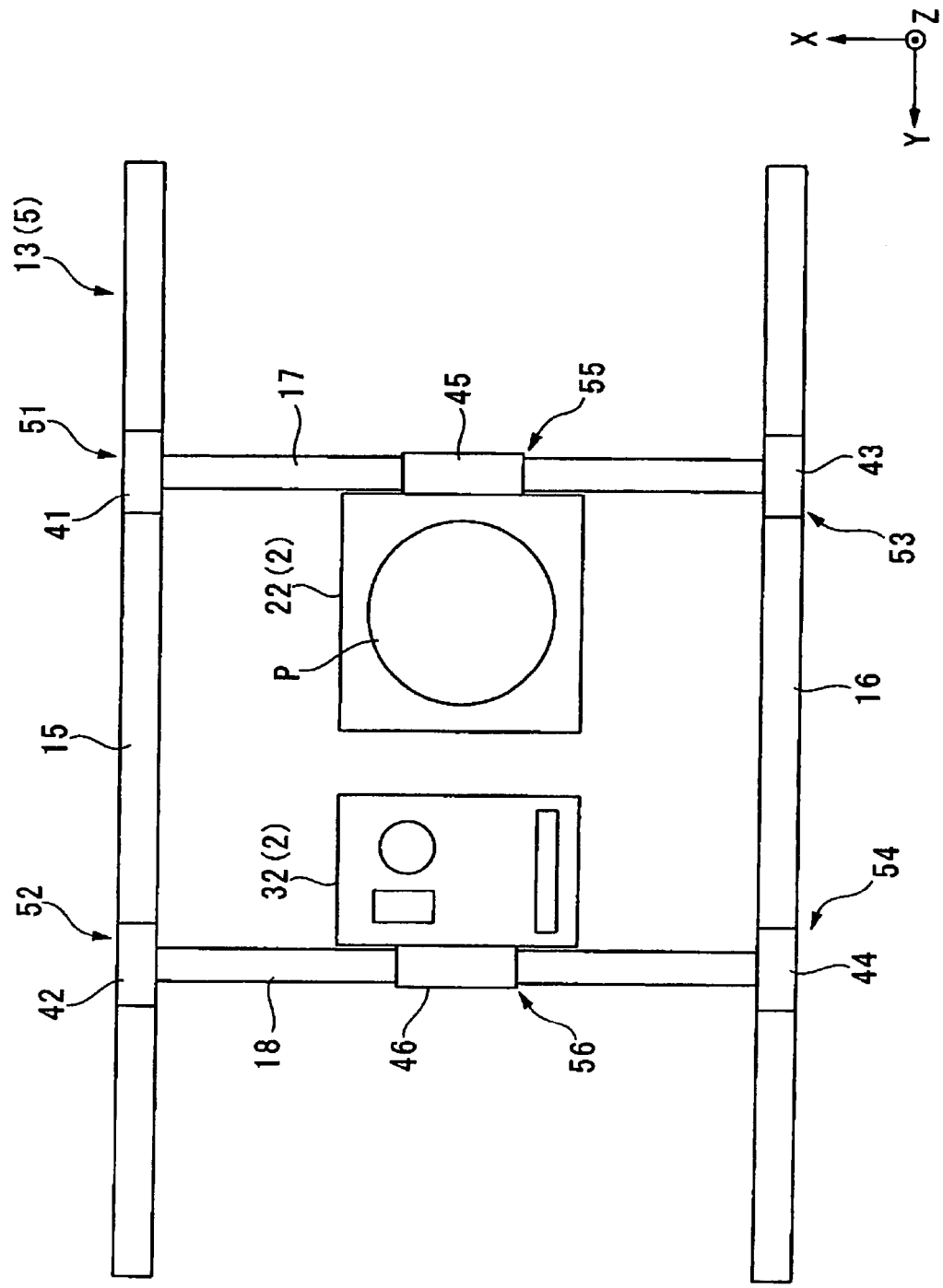
FIG. 2 is a top view showing a substrate stage and a measurement stage.

FIG. 2 shows the substrate stage 2 and the measurement stage 3 viewed from the top side. In FIG. 2, the coarse movement system 13 for moving the substrate stage 2 and the measurement stage 3 includes a plurality of linear motors 51, 52, 53, 54, 55, and 56. The coarse movement system 13 includes a pair of Y axis guide members 15 and 16 extending in the Y axis direction. The Y axis guide members 15 and 16 respectively include a magnet unit having a plurality of permanent magnets. One Y axis guide member 15 supports two slide members 41 and 42 movably in the Y axis direction, and the other Y axis guide member 16 supports two slide members 43 and 44 movably in the Y axis direction. The slide members 41, 42, 43, and 44 respectively include a coil unit having an armature coil. That is, in the present embodiment, the moving coil type Y axis linear motors 51, 52, 53, and 54 are formed by the slide members 41, 42, 43, and 44 having a coil unit, and the Y axis guide members 15 and 16 having a magnet unit.

Furthermore, the coarse movement system 13 is provided with a pair of X axis guide members 17 and 18 extending in the X axis direction. The X axis guide members 17 and 18 are respectively provided with a coil unit having an armature coil. One of the X axis guide members 17 supports a slide member 45 connected to the stage main body 21 of the substrate stage 2 while allowing the slide member 45 to move in the X axis direction, and the other one of the X axis guide members 18 supports a slide member 46 connected to the stage main body 31 of the measurement stage 3 while allowing the slide member 46 to move in the X axis direction. The slide members 45 and 46 are respectively provided with a magnet unit having a plurality of permanent magnets. That is to say, in the present embodiment, there is formed the moving magnet type X axis linear motor 55 that drives the substrate stage 2 (stage main body 21) in the X axis direction using the slide member 45 having the magnet unit and the X axis guide member 17 having the coil unit. Similarly, there is formed the moving magnet type X axis linear motor 56 that drives the measurement stage 3 (stage main body 31) in the X axis direction using the slide member 46 having the magnet unit and the X axis guide member 18 having the coil unit.

The slide members 41 and 43 are respectively fixed on one end and the other end of the X axis guide member 17, and the slide member 42 and 44 are respectively fixed on one end and the other end of the X axis guide member 18. Therefore, the X axis guide member 17 can be moved in the Y axis direction by the Y axis linear motors 51 and 53, and the X axis guide member 18 can be moved in the Y axis direction by the Y axis linear motors 52 and 54.

By slightly changing the driving forces respectively generated by the pair of the Y axis linear motors 51 and 53, the position of the substrate stage 2 in the θZ direction can be controlled, and by slightly changing driving forces respectively generated by the pair of the linear motors 52 and 54, the position of the measurement stage 3 in the θZ direction can be controlled.

As shown in FIG. 1, the fine movement system 14 includes actuators 14V such as a voice coil motor and a measurement device (such as an encoder) not shown in the drawing for measuring the drive amount of the respective actuators 14V, which are arranged between the respective stage main bodies 21, 31 and the respective tables 22, 32, and the fine movement system can move the respective tables 22, 32 on the respective stage main bodies 21, 31 at least in the Z axis, the θX, and the θY directions. Moreover, the fine movement system 14 can move (finely move) the respective tables 22, 32 on the respective stage main bodies 21, 31 in the X axis, the Y axis, and the θZ directions.

Accordingly, the driving mechanism 5 including the coarse movement system 13 and the fine movement system 14 can respectively move the substrate table 22 and the measurement table 32 in the directions of six degrees of freedom of the X axis, the Y axis, the Z axis, the θX, the θY, and the θZ directions.

The positional information of the substrate table 22 (and therefore of the substrate P) of the substrate stage 2, and the positional information of the measurement table 32 of the measurement stage 3 are measured by a laser interferometer 6B of the measurement system 6. The laser interferometer 6B measures the positional information of the respective tables 22 and 32 in relation to the X axis, the Y axis, and the θZ directions, using measurement mirrors 22F and 32F of the respective tables 22 and 32. Moreover, the surface positional information (positional information in relation to the Z axis, the θX, and the θY directions) of the surface of the substrate P held by the holding section 23 of the substrate table 22 and the substrate stage 2, and the surface positional information of a predetermined region of the top surface of the measurement table 32 of the measurement stage 3 are detected by a focus leveling detection system 60 (refer to FIG. 3) of the measurement system 6. The control device 7 drives the driving mechanism 5 based on the measurement result of the laser interferometer 6B of the measurement system 6 and the detection result of the focus leveling detection system 60 to control the position of the substrate P held by the substrate table 22 and the holding section 23 of the substrate table 22, and the position of the measurement table 32.

For example, Japanese Unexamined Patent Application, First Publication No. H11-135400 and Japanese Unexamined Patent Application, First Publication No. 2000-164504 (corresponding U.S. Pat. No. 6,897,963) disclose exposure apparatuses provided with a substrate stage for holding a substrate, and with a measurement stage on which is mounted a measurement instrument.

Figure 3:
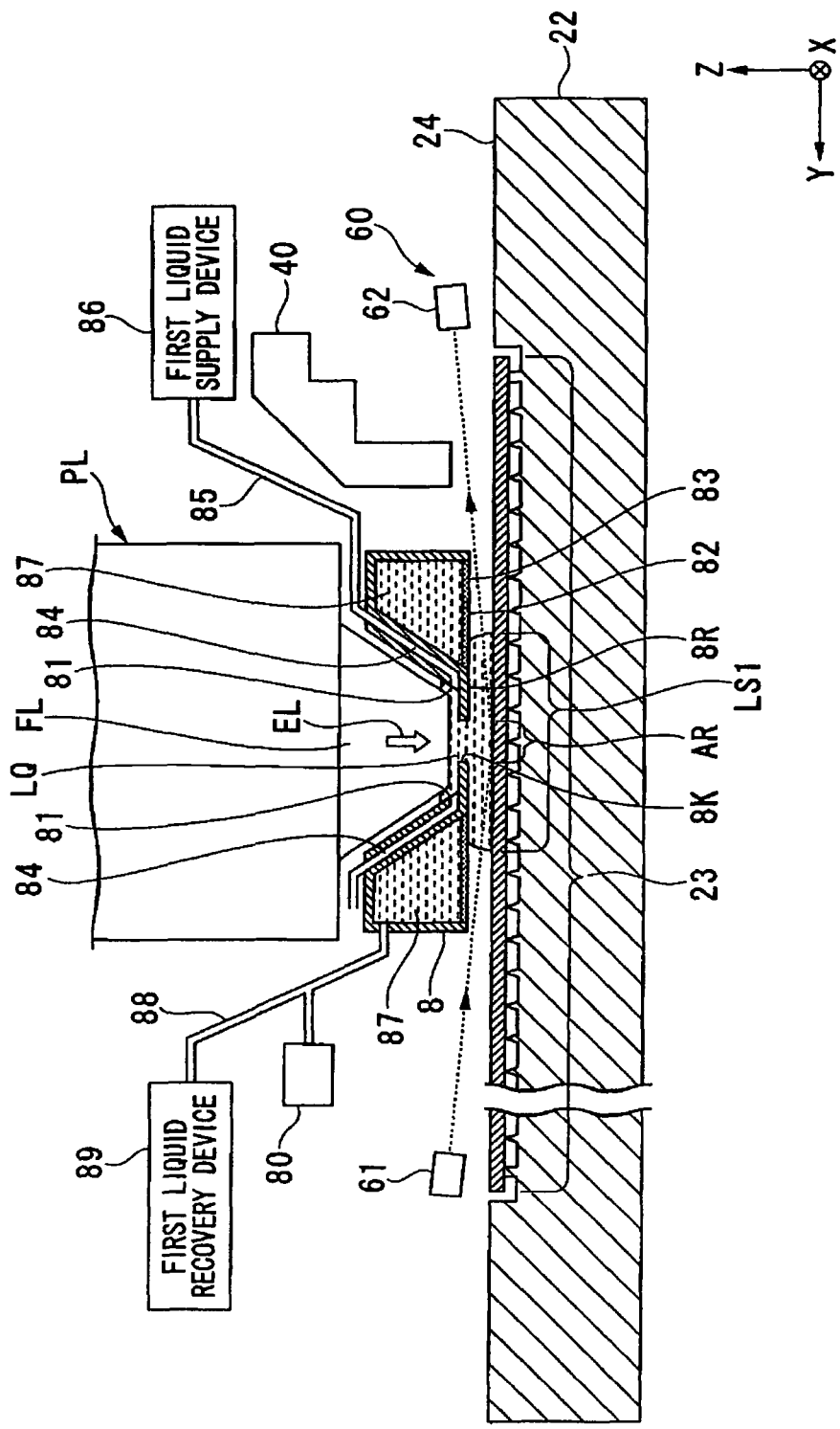
FIG. 3 is a sectional side view showing the vicinity of a first nozzle member.

FIG. 3 is a drawing showing the vicinity of the first nozzle member 8. FIG. 3 does not show the second nozzle member 9 or the third nozzle member 12. Moreover, in the following description, an example of the case where the substrate P is arranged in a position opposing the first nozzle member 8, and the first nozzle member 8 holds the first liquid LQ between the first nozzle member 8 and the surface of the substrate P to form the first liquid immersion space LS1, is described.

The first nozzle member 8 can form the first liquid immersion space LS1 with the first liquid LQ. The first nozzle member 8 is arranged so as to oppose the surface of the substrate P in the vicinity of a terminal optical element FL that is the closest element of the projection optical system PL to the image plane. The first nozzle member 8 has a bottom surface that opposes the surface of the substrate P and can hold the first liquid LQ between the bottom surface and the surface of the substrate P. The first nozzle member 8 forms the first liquid immersion space LS1 between the first nozzle member 8 and the surface of the substrate P so as to fill the optical path space for the exposure light EL on the image plane side (light emitting side) of the projection optical system PL by holding the first liquid LQ between the first nozzle member 8 and the surface of the substrate P with the first liquid LQ. Specifically, it forms the first liquid immersion space LS1 between the first nozzle member 8 and the surface of the substrate P so as to fill the optical path space for the exposure light EL between the projection optical system PL and the substrate P, with the first liquid LQ.

The exposure apparatus EX forms the first liquid immersion space LS1 by means of the first nozzle member 8 so as to fill the optical path space for the exposure light EL on the light emitting side of the projection optical system PL, with the first liquid LQ at least while the pattern image of the mask M is projected onto the substrate P, and it exposes the substrate P by irradiating the exposure light EL that has passed through the mask M onto the substrate P held by the substrate stage 2, via the first liquid LQ and the projection optical system PL. As a result, the pattern image of the mask M is projected onto the substrate P.

As described above, in the present embodiment, the exposure apparatus EX forms the first liquid immersion space LS1 between the first nozzle member 8 and the object so that one portion of the region (local region) of the surface of the object is covered by the first liquid LQ. In the present embodiment, the exposure apparatus EX employs a local liquid immersion method, in which the first immersion space LS1 is formed between the first nozzle member 8 and the substrate P so that one portion of the region on the substrate P including a projection region AR of the projection optical system PL is covered by the first liquid LQ.

The first nozzle member 8 has a supply port 81 that can supply the first liquid LQ, and a recovery port 82 that can recover the first liquid LQ. In the recovery port 82 there is arranged a porous member (mesh) 83. The bottom surface of the first nozzle member 8 that can oppose the surface of the substrate P includes each of the bottom surfaces of the porous member 83 and a flat surface 8R arranged so as to surround an aperture 8K through which the exposure light EL passes.

The supply port 81 is in fluid communication via a supply passage 84 formed inside the first nozzle member 8, and a supply pipe 85, with a first liquid supply device 86 that can deliver the first liquid LQ. The recovery port 82 is in fluid communication via a recovery passage 87 formed inside the first nozzle member 8, and a recovery pipe 88, with a first liquid recovery device 89 that can at least recover the first liquid LQ.

The first liquid supply device 86 can deliver clean and temperature-regulated first liquid LQ. Moreover, the first liquid recovery device 89 is provided with a vacuum system and is able to recover the first liquid LQ. Operations of the first liquid supply device 86 and the first liquid recovery device 89 are controlled by the control device 7. The first liquid LQ delivered from the first liquid supply device 86 flows through the supply pipe 85 and the supply passage 84 of the first nozzle member 8, and is then supplied from the supply port 81 into the optical path space for the exposure light EL. Moreover, the first liquid LQ recovered from the recovery port 82 by driving the first liquid recovery device 89, flows through the supply passage 87 of the first nozzle member 8 and is then recovered into the first liquid recovery device 89 via the recovery pipe 88. The control device 7 carries out the operation of liquid supply from the supply port 81 and the operation of liquid recovery into the recovery port 82 in parallel, and thereby forms the first liquid immersion space LS1 of the first liquid LQ so as to fill the optical path space for the exposure light EL between the terminal optical element FL and the substrate P, with the first liquid LQ.

In the present embodiment, water (purified water) is used as the first liquid LQ.

Moreover, in the present embodiment, the exposure apparatus EX is provided with a detection device 80 that can detect the quality (water quality) of the first liquid LQ that has been recovered from the recovery port 82. The detection device 80, for example, includes a TOC meter for measuring the total organic carbon in the first liquid LQ, and a particle counter for measuring foreign substances including fine particles and bubbles, and it is able to detect the contamination status (quality) of the first liquid LQ recovered from the recovery port 82.

Also, as shown in FIG. 3, the exposure apparatus EX of the present embodiment is provided with an off-axis type alignment system 40 for detecting an alignment mark on the substrate P and a reference mark on the measurement stage 3. For example, the alignment system 40 is a FIA (Field Image Alignment) type alignment system disclosed in Japanese Unexamined Patent Application, First Publication No. H04-65603 (corresponding U.S. Pat. No. 5,493,403), in which the position of the mark is measured by irradiating a broadband detection light beam that does not expose the light sensitive material of the substrate P, onto an object mark (such as an alignment mark and a reference mark), image-capturing an image of the object mark imaged on a light receiving surface by the light reflected from the object mark, and an image of an index (index mark on an index plate provided within the alignment system) using an image capturing device (such as CCD), and image-processing these image-captured signals.

The alignment system 40 has an image capturing device and is able to acquire not only an image of a mark but also an optical image (image) of an object arranged within the detection region of the alignment system 40.

Furthermore, as shown in FIG. 3, the exposure apparatus EX is provided with the focus leveling detection system 60 that can detect surface positional information of the surface of the substrate P. The focus leveling detection system 60 has a projection device 61 that can diagonally project detection light onto the surface of the substrate P, and a light receiving device 62 that is arranged in a predetermined position with respect to the detection light and that can receive the detection light that is emitted from the projection device 61 and reflected on the surface of the substrate P.

The focus leveling detection system 60 is configured to carry out detection of the surface positional information of the surface of the substrate P where the substrate P opposes the projection optical system PL and/or the first nozzle member 8. However, it is not limited to this configuration and may be configured so as to carry out detection of the surface positional information of the surface of the substrate P where the substrate P does not oppose the projection optical system PL and/or the first nozzle member 8.

Figure 4:
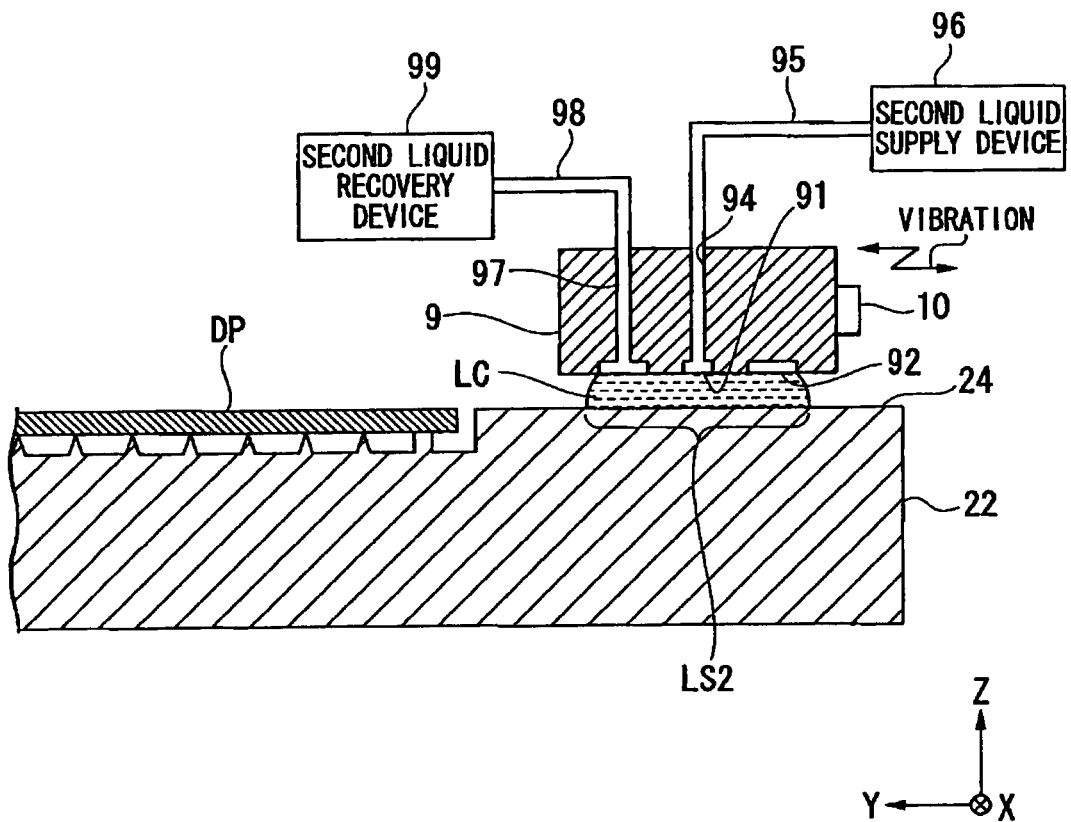
FIG. 4 is a sectional side view showing the vicinity of a second nozzle member.
Figure 5:
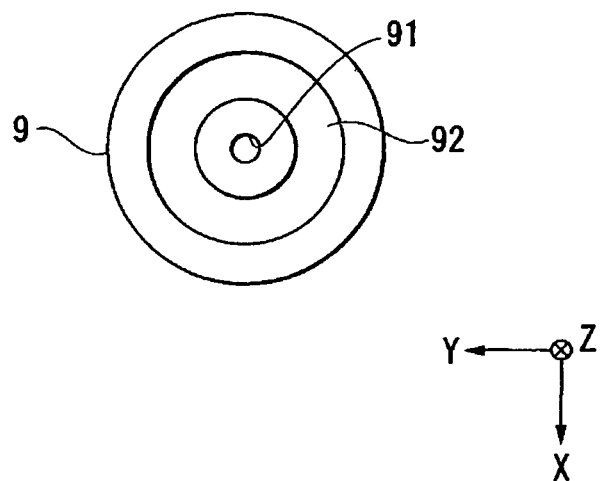
FIG. 5 is a bottom view showing the second nozzle member.

FIG. 4 is a side sectional view showing the vicinity of the second nozzle member 9, and FIG. 5 is a bottom view of the second nozzle member 9. FIG. 4 does not show the first nozzle member 8 and the third nozzle member 12. Moreover, in the following description, an example of the case where the substrate table 22 is arranged in a position opposing the second nozzle member 9, and the second nozzle member 9 holds the second liquid LC between the second nozzle member 9 and the top surface 24 of the substrate table 22 to form the second liquid immersion space LS2, is described.

The second nozzle member 9 can form the second liquid immersion space LS2 with the second liquid LC. The second nozzle member 9 is arranged in a position distanced from the first nozzle member 8. The second nozzle member 9 has a bottom surface, the top surface 24 of the substrate table 22 can oppose the bottom surface of the second nozzle member 9. The second liquid LC can be held between the bottom surface of the second nozzle member 9 and the top surface 24 of the substrate table 22. The second nozzle member 9, by holding the second liquid LC between the second nozzle member 9 and the top surface 24 of the substrate table 22, can form the second liquid immersion space LS2 between the second nozzle member 9 and the top surface 24 of the substrate 22 in a position distanced from the first nozzle member 8.

As described above, in the present embodiment, the exposure apparatus EX forms the second liquid immersion space LS2 between the second nozzle member 9 and the object so that one portion of the region (local region) of the surface of the object is covered by the second liquid LC.

The second nozzle member 9 has a supply port 91 that can supply the second liquid LC, and a recovery port 92 that can recover the second liquid LC. The supply port 91 is formed substantially in the center of the bottom surface of the second nozzle member 9 that opposes the top surface 24 of the substrate table 22. The recovery port 92 is formed on the bottom surface of the second nozzle member 9 so as to surround the supply port 91.

The supply port 91 is connected via a supply passage 94 formed inside the second nozzle member 9, and a supply pipe 95, to a second liquid supply device 96 that can deliver the second liquid LC. The recovery port 92 is connected via a recovery passage 97 formed inside the second nozzle member 9, and a recovery pipe 98, to a second liquid recovery device 99 that can recover the second liquid LC.

Operations of the second liquid supply device 96 and the second liquid recovery device 99 are controlled by the control device 7. The second liquid LC delivered from the second liquid supply device 96 flows through the supply pipe 95 and the supply passage 94 of the second nozzle member 9, and is then supplied from the supply port 91 into between the bottom surface of the second nozzle member 9 and the top surface 24 of the substrate table 22. Moreover, the second liquid LC recovered from the recovery port 92 by driving the second liquid recovery device 99 flows through the recovery passage 97 of the second nozzle member 9 and is then recovered into the second liquid recovery device 99 via the recovery pipe 98. The control device 7 carries out an operation of liquid supply from the supply port 91 and an operation of liquid recovery by the recovery port 92 in parallel, and thereby forms the second liquid immersion space LS2 with the second liquid LC so that a part of the top surface 24 of the substrate table 22 is covered by the second liquid LC.

In the present embodiment, the second liquid LC is different from the first liquid LQ. In the present embodiment, hydrogen water (hydrogen solution) in which hydrogen gas is dissolved in water is used as the second liquid LC.

As the second liquid LC, dissolved gas control water in which a predetermined gas is dissolved in water, such as ozone water (ozone solution) in which ozone gas is dissolved in water, nitrogen water (nitrogen solution) in which nitrogen gas is dissolved in water, argon water (argon solution) in which argon gas is dissolved in water, and carbon dioxide water (carbon dioxide solution) in which carbon dioxide is dissolved in water, may be used. Moreover, as the second liquid LC, chemical added water in which a predetermined chemical solution is added to water, such as hydrogen peroxide solution in which hydrogen peroxide is added to water, chlorine added water in which hydrochloric acid (hypochlorite) is added to water, ammonia water in which ammonia is added to water, choline water in which choline is added to water, and sulfuric acid added water in which sulfuric acid is added to water, may be used. Moreover, as the second liquid LC, alcohols such as ethanol and methanol, ethers, gamma butyrolactone, thinners, surfactants, or fluorinated solvent such as HFE may be used.

The ultrasonic wave generator 10 imparts ultrasonic waves (vibration) to the second liquid LC of the second liquid immersion space LS2. In the present embodiment, the ultrasonic wave generator 10 has an ultrasonic oscillator connected to the second nozzle member 9 and imparts ultrasonic waves to the second liquid LC of the second liquid immersion space LS2 by vibrating the second nozzle member 9. In the present embodiment, the ultrasonic oscillator of the ultrasonic wave generator 10 is arranged on the side surface of the second nozzle member 9.

Figure 6:
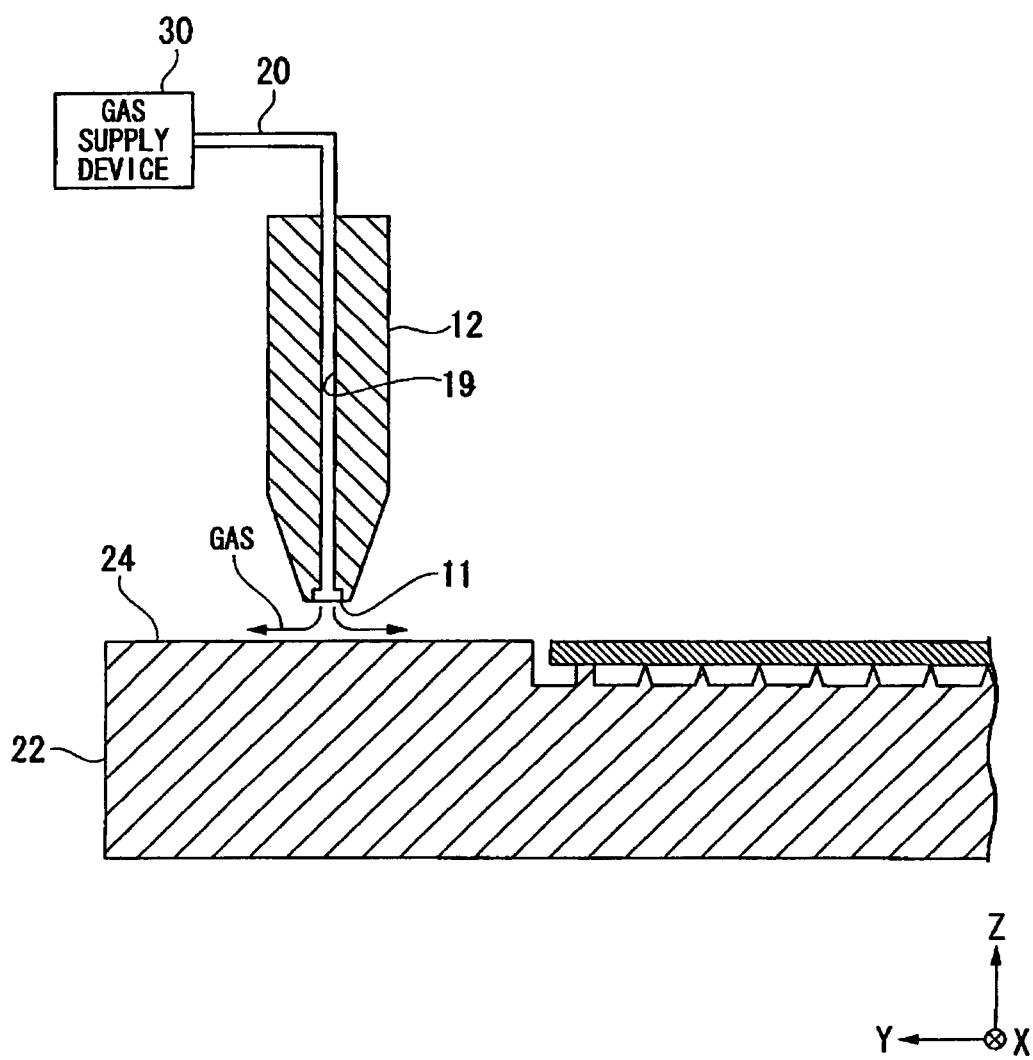
FIG. 6 is a sectional side view showing the vicinity of a third nozzle member.

FIG. 6 is a sectional side view showing the vicinity of the third nozzle member. FIG. 6 does not show the first nozzle member 8 and the second nozzle member 9. Moreover, in the following description, an example of the case where the substrate table 22 is arranged in the position opposing a third nozzle member 12 is described.

The third nozzle member 12 has a gas supply port 11 that is able to supply gas 20 toward the substrate table 22, in a position distanced from the first nozzle member 8 and the second nozzle member 9. The gas supply port 11 of the third nozzle member 12 removes at least either one of the first liquid LQ and the second liquid LC on the substrate table 22 by supplying gas toward the substrate table 22. The gas supply port 11 of the third nozzle member 12 supplies gas toward the substrate table 22 to vaporize at 25 least either one of the first liquid LQ and the second liquid LC on the substrate table 22, and at least either one of the first liquid LQ and the second liquid LC is thereby removed. At least either one of the first liquid LQ and the second liquid LC on the substrate table 22 may be blown off by supplying gas from the gas supply port 11.

The gas supply port 11 is formed in the bottom surface of the third nozzle member 12 that opposes the top sure 24 of the substrate table 22, and supplies gas from a distanced position above the substrate table 22 onto the top surface 24 of the substrate table 22. The gas supply port 11 is connected via a gas supply passage 19 formed inside the third nozzle member 12, and a gas supply pipe 20, to a gas supply device 30 that can deliver gas.

The gas supply device 30 is able to deliver clean and temperature-regulated gas. Operation of the gas supply device 30 is controlled by the control device 7. The gas delivered from the gas supply device 30 flows through the gas supply pipe 20 and the gas supply passage 19 of the third nozzle member 12, and is then supplied from the gas supply port 11 toward the top surface 24 of the substrate table 22.

In the present embodiment, dry air is used as the gas for liquid removal. Dry nitrogen gas may also be used as the gas for liquid removal.

Next, a method of exposing the substrate P using the exposure apparatus EX having the above described configuration is described.

For example, the control device 7 uses the driving mechanism 5 to arrange the measurement stage 3 in the position opposing the first nozzle member 8, and uses the first liquid LQ to form the first liquid immersion space LS1 between the first nozzle member 8 and the measurement stage 3. The control device 7 carries out measurements by various types of measurement instruments arranged on the measurement stage 3 via the first liquid immersion space LS1 formed with the first liquid LQ. The control device 7 then adjusts exposure conditions such as imaging characteristics of the projection optical system PL for exposing the substrate P, based on measurement results of these measurement instruments, and starts the exposure operation for the substrate P. When exposing the substrate P, the control device 7 uses the driving mechanism 5 to arrange the substrate stage 2 holding the substrate P, in a position that opposes the first nozzle member 8, and forms the first liquid immersion space LS1 between the first nozzle member 8 and the substrate stage 2 (substrate P).

As disclosed in PCT International Publication No. WO2005/074014 (corresponding to U.S. Patent Application, Publication No. 2007/0127006) for example, in the exposure apparatus EX of the present embodiment, within a predetermined region including the position opposing the light emitting surface of the projection optical system PL (the position directly below the projection optical system PL), in the state where the top surface 24 of the substrate stage 2 (substrate table 22) and the top surface 34 of the measurement stage 3 (measurement table 32) are in close proximity of or in contact with each other, the first liquid immersion space LS1 can be moved between the top surface 24 of the substrate stage 2 and the top surface 34 of the measurement stage 3 by moving the substrate stage 2 and the measurement stage 3 together in the XY directions with respect to the first nozzle member 8. The substrate stage 2 and the measurement stage 3 are respectively able to move on the light emitting side of the terminal optical element FL through which the exposure light EL passes. After forming the first liquid immersion space LS1 between the first nozzle member 8 and the measurement stage 3, and executing a predetermined measurement operation using the measurement stage 3, the exposure apparatus EX can make the substrate stage 2 oppose the first nozzle member 8 while maintaining the state of the first liquid immersion space LS1 being formed (that is to say, while maintaining the state of the terminal optical element FL being in contact with the first liquid LQ).

The control device 7 irradiates the exposure light EL onto the substrate P via the first liquid immersion space LS1 formed with the first liquid LQ, to expose the substrate P. After the exposure of the substrate P is completed, while maintaining the state of the first liquid immersion space LS1 being formed, the control device 7 moves the substrate stage 2 and the measurement stage 3 together in the XY directions with respect to the first nozzle member 8 so as to make the measurement stage 3 oppose the first nozzle member 8, in the state where the top surface 24 of the substrate stage 2 and the top surface 34 of the measurement stage 3 are in close proximity to each other or in contact with each other, within a predetermined region including the position that opposes the light emitting surface of the projection optical system PL. As a result, the first liquid immersion space LS1 is formed between the first nozzle member 8 and the measurement stage 3.

Subsequently, the control device 7 moves the substrate stage 2 holding the substrate P for which exposure is completed, to a predetermined substrate exchange position, and unloads the substrate P for which exposure is completed from the substrate stage 2 while loading a substrate P to be exposed onto the substrate stage 2. Moreover, while the substrate is being replaced in the substrate exchange position, the control device 7 carries out a measurement operation via the first liquid LQ of the first liquid immersion space LS1 using the measurement stage 3. Having loaded the substrate P onto the substrate stage 2, as described above, the control device 7 moves the substrate stage 2 and the measurement stage 3 together in the XY directions with respect to the first nozzle member 8 so as to make the substrate stage 2 oppose the first nozzle member 8, in the state where the top surface 24 of the substrate stage 2 and the top surface 34 of the measurement stage 3 are in close proximity to each other or in contact with each other, within the predetermined region including the position that opposes the light emitting surface of the projection optical system PL. As a result, the first liquid immersion space LS1 is formed between the first nozzle member 8 and the substrate stage 2. The control device 7 exposes the substrate P via the first liquid LQ of the first liquid immersion space LS1.

The control device 7 repeats the above operations to sequentially expose a plurality of the substrates P.

While carrying out the measurement operation via the first liquid immersion space LS1 using the measurement stage 3, and while carrying out the exposure operation onto the substrate P on the substrate stage 2 via the first liquid immersion space LS1, the control device 7 does not form the second liquid immersion space LS2. Moreover, while carrying out the measurement operation via the first liquid immersion space LS1 using the measurement stage 3 and while carrying out the exposure operation on the substrate P on the substrate stage 2 via the first liquid immersion space LS1, the control device 7 does not carry out the gas supply operation using the gas supply port 11.

When exposing the substrate P, the first liquid LQ of the first liquid immersion space LS1 is brought into contact with the surface of the substrate P, the bottom surface of the terminal optical element FL, and the bottom surface of the first nozzle member 8 respectively. Also, the first liquid LQ of the first liquid immersion space LS1 is brought into contact with the substrate stage 2 (substrate table 22) and the measurement stage 3 (measurement table 32) respectively.

There is a possibility that some portion of the substance of the substrate P (for example, some portion of photosensitive material), for example, may leach out into the first liquid LQ in contact with the substrate P, and the substance may become attached to at least any one member of the bottom surface of the terminal optical element FL, the bottom surface of the first nozzle member 8, the substrate stage 2 (substrate table 22), and the measurement stage 3 (measurement table 32), resulting in contamination of such members. Moreover, there is a possibility that the respective members may be contaminated not only by the substance leached out from the substrate P, but also by a substance (foreign substance) floating in a space in the exposure apparatus EX is disposed, for example.

The above mentioned substance may become a foreign substance if these members are left in the state of being contaminated, and it may cause a defect in the pattern formed on the substrate P for example, and affect the exposure precision or the precisions of various kinds of measurements, resulting in a reduced performance of the exposure apparatus EX.

In particular, if the substrate stage 2 is left in a state of being contaminated, the substrate table 22 may become unable to hold the substrate P in a good condition, and exposure of the substrate P may not be carried out well. Moreover, in the case where the substrate stage 2 is contaminated, a substrate P that has been loaded onto the substrate stage 2 may become contaminated, or the carrying device that loads the substrate P onto the substrate stage 2 or the carrying device that unloads the substrate P from the substrate stage 2 may become contaminated, resulting in expansion of the contamination.

Furthermore, if the measurement stage 3 is left in the state of being contaminated, measurement precision of the measurement instrument mounted on the measurement stage 3 is reduced, and consequently there may be an affect on exposure operations that are carried out based on the measurement results.

Therefore, in the present embodiment, at least either one of the substrate stage 2 and the measurement stage 3, which can move into the position that opposes the second nozzle member 9, is cleaned using the second liquid LC. That is to say, in the present embodiment, the exposure apparatus EX forms the second liquid immersion space LS2 with the second liquid LC between the second nozzle member 9 and at least either one of the substrate stage 2 and the measurement stage 3 that opposes the second nozzle member 9, and cleans at least either one of the substrate stage 2 and the measurement stage 3 with the second liquid LC.

Next, an example of an operation of cleaning at least some portion of the exposure apparatus EX using the second liquid immersion space LS2 of the second liquid LC is described. In the following description, the case of cleaning the substrate table 22 using the second liquid LC is described as an example.

Figure 7:
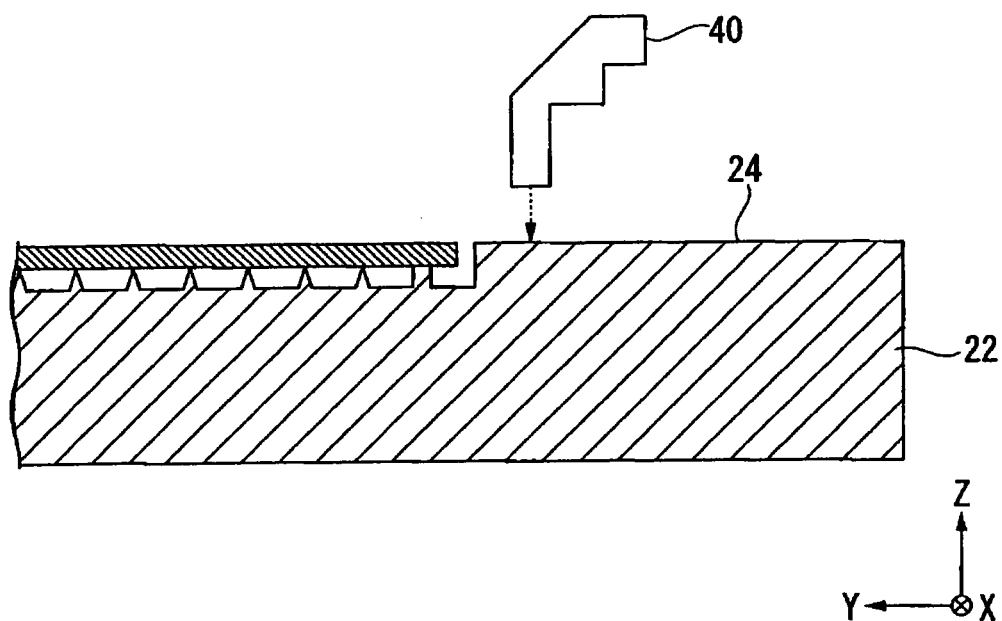
FIG. 7 is a diagram showing a status of detecting a contamination status of a substrate table.

As shown in FIG. 7, at every predetermined number of exposures of the substrates P, at every lot, or at every predetermined interval, the control device 7 makes the measurement system 6 measure the positional information of the substrate table 22 while it makes the alignment system 40 detect the contamination state of the substrate table 22. In the present embodiment, the cleaning operation for the substrate table 22 is controlled based on the detection result of the contamination state of the substrate table 22 from the alignment system 40. Based on detection results of the contamination state of the substrate table 22 from the alignment system 40, the control device 7 controls the operation of forming the second liquid immersion space LS2 by the second nozzle member 9.

As described above, in the present embodiment, the alignment system 40 includes an image-capturing device that can obtain an optical image (image) of an object. Accordingly, the alignment system 40 is able to obtain an image of the top surface 24 of the substrate table 22, and is able to detect the contamination state of the top surface 24 of the substrate table 22 based on the obtained image information. The detection result from the alignment system 40 is output to the control device 7, and the control device 7 determines whether or not the contamination state of the top surface 24 of the substrate table 22 is within an allowable range, or whether or not a foreign substance is present on the top surface 24 of the substrate table 22, based on the detection result from the alignment system 40.

In the present embodiment, in the control device 7 there is pre-stored image information (a reference image) of the top surface 24 of the substrate table 22 in a non-contaminated normal state (ideal state), and the control device 7 compares this pre-stored reference image information with actual image information of the top surface 24 of the substrate table 22 obtained by the alignment system 40. Based on the result of this comparison, the control device 7 determines whether or not the contamination state of the top surface 24 of the substrate 22 is within the allowable range.

If the contamination state of the top surface 24 of the substrate table 22 is determined to be within the allowable range, the control device 7 does not carry out the cleaning operation, and continues the normal exposure operation (exposure sequence). On the other hand, if the contamination state of the top surface 24 of the substrate table 22 is determined not to be within the allowable range, the control device 7 carries out the cleaning operation.

Figure 8:
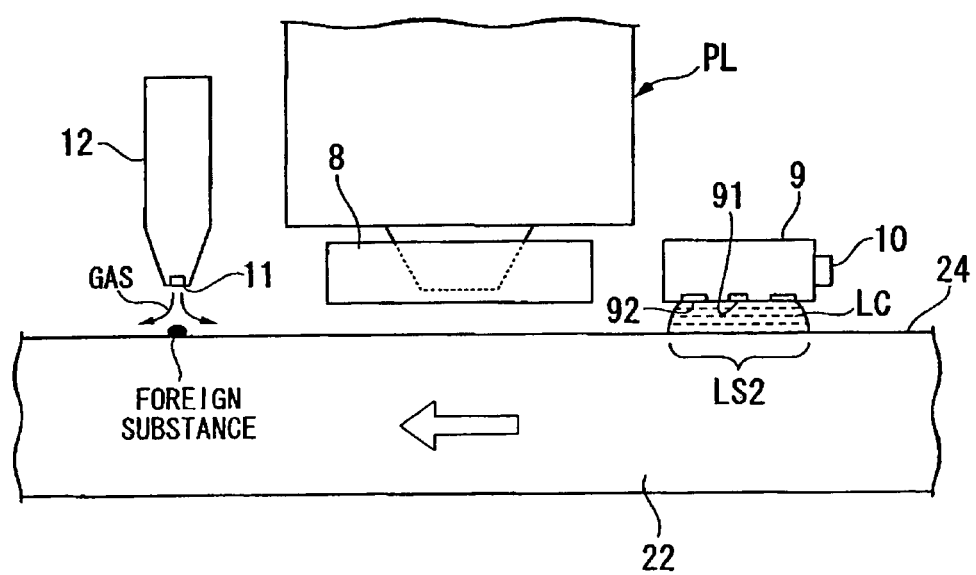
FIG. 8 is a side view showing the first, second, and third nozzle members.

Before starting the cleaning operation, the control device 7 stops the liquid supply operation of the supply port 81 of the first nozzle member 8, and recovers the first liquid LQ of the first liquid immersion space LS1 using the recovery port 82 of the first nozzle member 8 to remove the first liquid immersion space LS1. Subsequently, as shown in FIG. 8, in the state where the substrate table 22 opposes the second nozzle member 9, the control device 7 makes the supply port 91 of the second nozzle member 9 supply the second liquid LC, and starts the operation of forming the second liquid immersion space LS2 between the second nozzle member 9 and the substrate table 22.

Here, in the cleaning operation using the second liquid LC, the holding section 23 of the substrate table 22 holds a highly clean dummy substrate DP that is a separate substrate from the exposure substrate P and that is unlikely to release a foreign substance. The dummy substrate DP has an outer shape similar to that of the exposure substrate P, and can be held by the holding section 23. In the present embodiment, the holding section 23 is a so-called pin chuck mechanism and detachably holds the substrate P and the dummy substrate DP respectively.

In the state where the holding section 23 is not holding the dummy substrate DP and is exposed, the cleaning operation using the second liquid LC can also be carried out. As a result, not only the top surface 24 of the substrate table 22 but also the holding section 23 are brought into contact with the second liquid LC, and the holding section 23 can be cleaned well.

In the present embodiment, the second nozzle member 9 carries out the liquid supply operation from the supply port 91 and the liquid recovery operation by the recovery port 92 in parallel. As a result, the second liquid immersion space LS2 of the second liquid LC is formed between the second nozzle member 9 and the substrate table 22 so as to come into contact with the substrate table 22.

Moreover, as described above, the substrate stage 22 can be arranged in positions that respectively oppose the first nozzle member 8, the second nozzle member 9, and the third nozzle member 12. In the present embodiment, as shown in FIG. 8, the positional relationship of the substrate table 22 with respect to the second nozzle member 9 and the third nozzle member 12 is defined according to the size of the substrate table 22 so that the second nozzle member 9 and third nozzle member 12 can respectively oppose the substrate table 22 at the same time. As a result, as shown in FIG. 8, the second liquid immersion space LS2 can be formed within the region of one portion of the top surface 24 of the substrate table 22 by making this region of one portion of the top surface 24 of the substrate table 22 oppose the second nozzle member 9, while gas can be supplied from the gas supply port 11 into the other region of the top surface 24 of the substrate table 22 by making this other region oppose the third nozzle member 12.

The control device 7 imparts ultrasonic waves to the second liquid LC (hydrogen solution in the present embodiment) of the second liquid immersion space LS2 using the ultrasonic wave generator 10. Accordingly, in the present embodiment, the control device 7 forms the second liquid immersion space LS2 with the second liquid LC, and brings the substrate table 22 into contact with the second liquid LC of the second liquid immersion space LS2 while imparting ultrasonic waves to the second liquid LC of the second liquid immersion space LS2, and the substrate table 22 is thereby cleaned.

In the present embodiment, in the state where the second liquid immersion space LS2 has been formed, the control device 7 moves the substrate table 22 in the XY directions with respect to the second nozzle member 9. As a result, a large region of the substrate table 22 can be cleaned. In the state where the second liquid immersion space LS2 has been formed, even when the substrate table 22 is moving with respect to the second nozzle member 9, the supply operation from the supply port 91, and the recovery operation by the recovery port 92 are carried out in parallel while the ultrasonic waves are being imparted to the second liquid LC of the second liquid immersion space LS2.

Figure 9A:
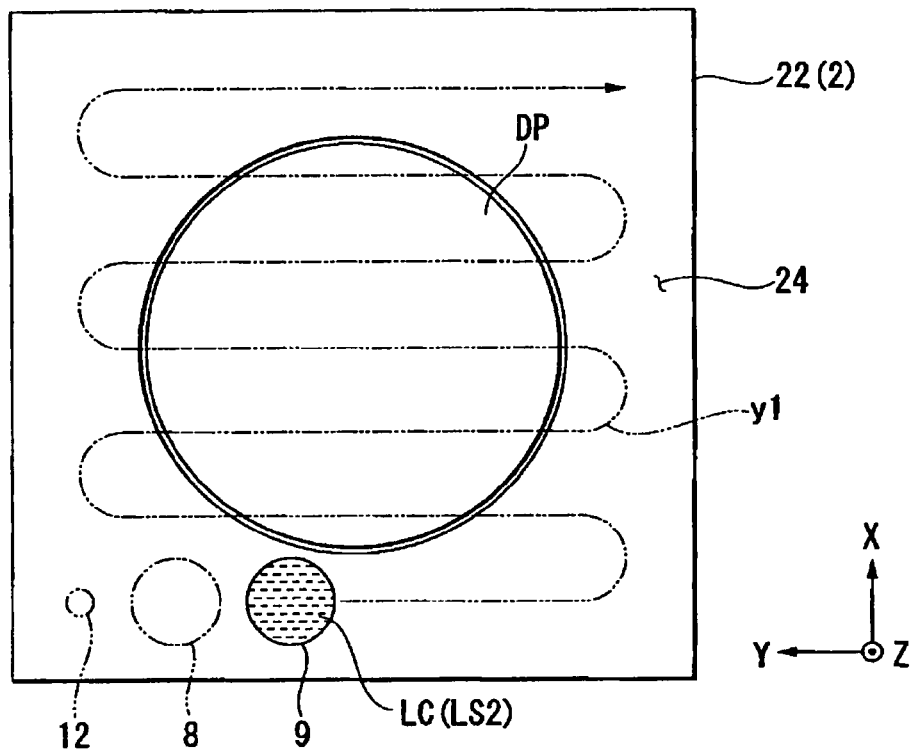
FIG. 9A is a schema for explaining an example of a cleaning method according to the first embodiment.
Figure 9B:
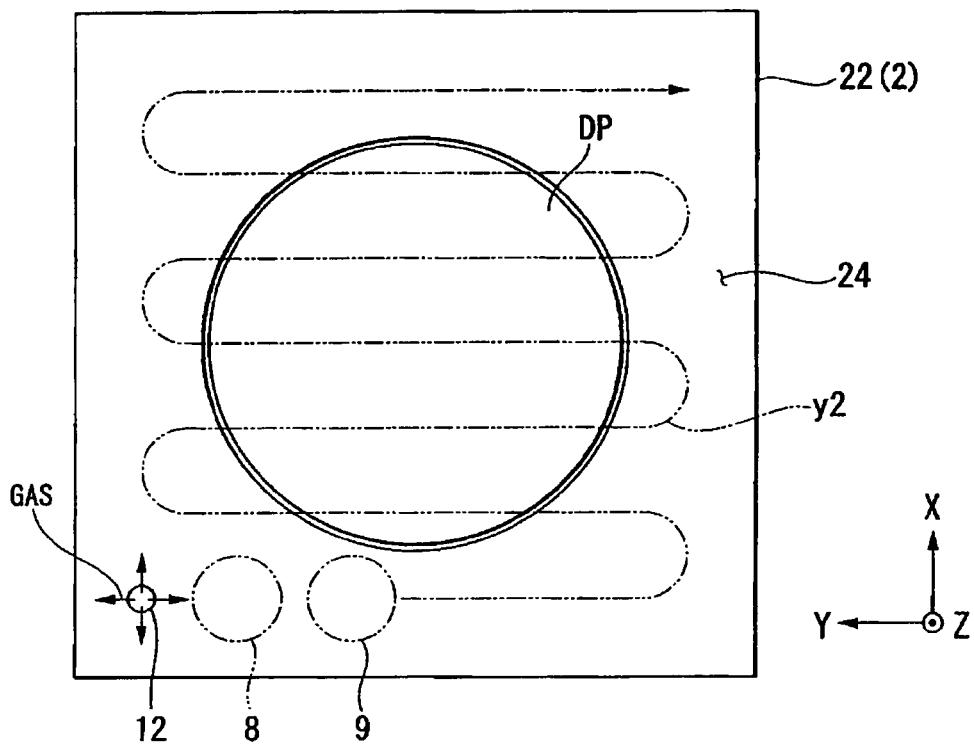
FIG. 9B is a schema for explaining an example of a cleaning method according to the first embodiment.

FIG. 9A and FIG. 9B are schematic views showing an example of the cleaning operation of the substrate table 22. As shown in FIG. 9A, in the state where the second liquid immersion space LS2 has been formed below the second nozzle member 9, the control device 7 moves the substrate table 22 with respect to the second nozzle member 9 as shown by the arrow y1 in FIG. 9A for example. That is to say, in the state where the second liquid immersion space LS2 has been formed, the control device 7 moves the substrate table 22 so that the second liquid immersion space LS2 moves in the X axis direction relatively to the substrate table 22, while moving back and forth in the Y axis direction. As a result, a large region of the substrate table 22 can be cleaned. Furthermore, in the state where the second liquid immersion space LS2 has been formed, the gas supply operation from the gas supply port 11 of the third nozzle member 12 is suspended.

After the relative movement of the second liquid immersion space LS2 and the substrate table 22 is completed, the control device 7 stops the liquid supply operation from the supply port 91 of the second nozzle member 9 and recovers the second liquid LC of the second liquid immersion space LS2 using the recovery port 92 of the second nozzle member 9 to remove the second liquid immersion space LS2. As a result, the cleaning operation using the second liquid LC of the second liquid immersion space LS2 is completed.

Subsequently, as shown in FIG. 9B, the control device 7 makes the substrate table 22 oppose the third nozzle member 12, and starts the operation of supplying gas from the gas supply port 11 formed in the third nozzle member 12 toward the substrate table 22. As shown in FIG. 9B, in the state where the gas supply operation from the gas supply port 11 of the third nozzle member 12 is being carried out, the control device 7 moves the substrate table 22 with respect to the third nozzle member 12 as shown by the arrow y2 in FIG. 9B for example. That is to say, while supplying gas from the gas supply port 11 to the top surface 24 of the substrate table 22, the control device 7 moves the substrate table 22 so that the gas supply port 11 moves in the X axis direction relatively to the substrate table 22, while moving back and forth in the Y axis direction.

Even after completion of the cleaning operation using the second liquid LC of the second liquid immersion space LS2, for example, the second liquid LC that has been missed in recovery by the recovery port 92 of the second nozzle member 9 may still remain on the substrate table 22. In the present embodiment, after completion of the cleaning operation using the second liquid LC of the second liquid immersion space LS2, the second liquid LC on the substrate table 22 can be removed by supplying gas toward the top surface 24 of the substrate table 22 from the gas supply port 11.

Figure 10:
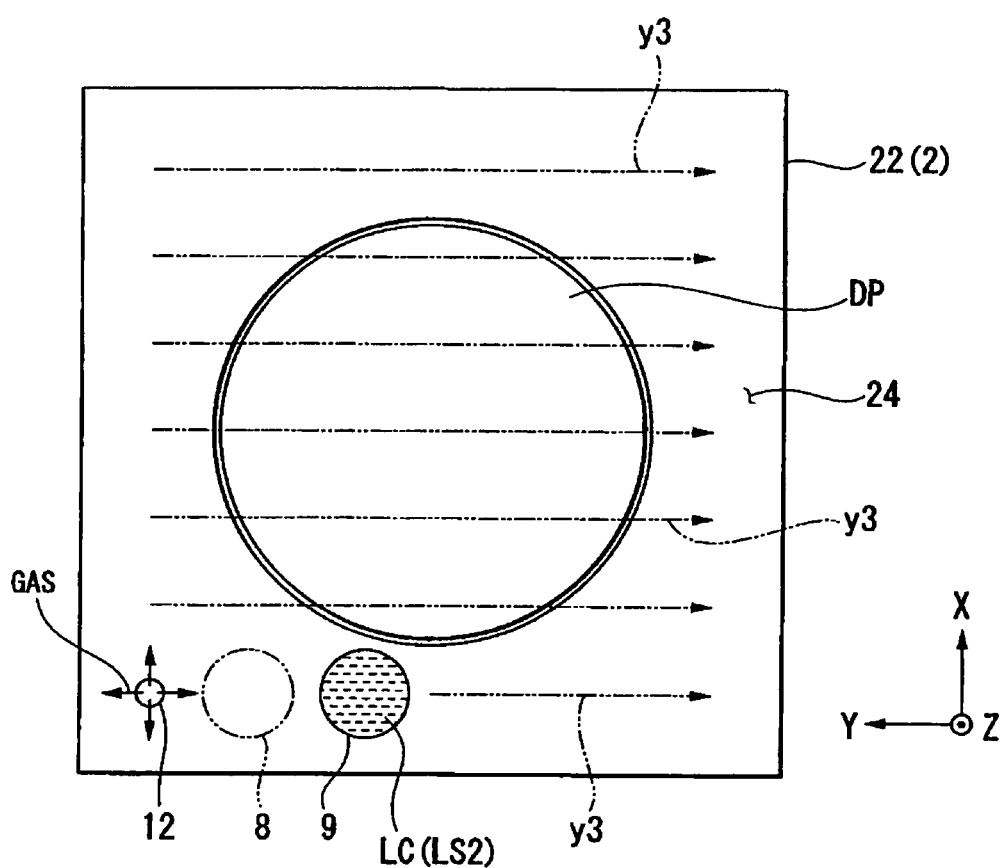
FIG. 10 is a schema for explaining an example of a cleaning method according to the first embodiment.

FIG. 10 is a schema showing an example of the cleaning operation of the substrate table 22. As shown in FIG. 10, in the state where the second liquid immersion space LS2 has been formed below the second nozzle member 9, the control device 7 moves the substrate table 22 with respect to the second nozzle member 9 as shown by the arrow y3 in FIG. 10. That is to say, in the state where the second liquid immersion space LS2 has been formed, the control device 7 moves the substrate table 22 so that the second liquid immersion space LS2 moves with respect to the substrate table 22 in one direction in relation to the Y axis direction and step-moves in the X axis direction when a movement in this one direction is completed. After completion of the step-movement, the control device 7 moves the substrate table 22 so that the second liquid immersion space LS2 moves with respect to the substrate table 22 in one direction in relation to the Y axis direction. Thereafter, the control device 7 similarly repeats the movement in one direction in the Y axis direction and the step-movement in the X axis direction. Moreover, in the example shown in FIG. 10, the operation of forming the second liquid immersion space LS2, and at least some part of the gas supply operation from the gas supply port 11 are carried out in parallel. Moreover, in the example shown in FIG. 10, the movement condition (movement path) of the substrate table 22 is defined according to the positional relationship of the substrate table 22 with respect to the second nozzle member 9 and the third nozzle member 12 so that gas is supplied from the gas supply port 11 into the region on the top surface 24 of the substrate table 22 after the region has been brought into contact with the second liquid LC of the second liquid immersion space LS2. Thereby a large region of the substrate table 22 can also be cleaned well, and the second liquid LC can be kept from remaining on the substrate table 22.

Furthermore, as described above, since the control device 7 measures the positional information of the substrate table 22 using the measurement system 6 while detecting the contamination state of the substrate table 22 using the alignment system 40, a contaminated region can be identified within the co-ordinate system specified by the laser interferometer 6B. Therefore, the control device 7 can carry out intensive cleaning on a region on the contaminated substrate table 22 using the second liquid LC of the second liquid immersion space LS2.

As described above so far, since there is provided the second nozzle member 9 for forming the second liquid immersion space LS2 with the second liquid LC for cleaning the substrate table 22, as a separate member from the first nozzle member 8 that forms the first liquid immersion space LS1 for filling the optical path space for the exposure light EL with the first liquid LQ, the substrate table 22 can be cleaned well. Therefore, a reduction in performance of the exposure apparatus EX caused by contamination of the substrate table 22 can suppressed.

By providing the second nozzle member 9 that is dedicated for cleaning the substrate table 22 using the second liquid LC as a separate member from the first nozzle member 8 that forms the first liquid immersion space LS1 with the first liquid LQ, a second liquid that is appropriate for cleaning and is a separate liquid from the first liquid LQ can be used. The first nozzle member 8 is formed from the most appropriate material according to the physical properties of the first liquid LQ, or the most appropriate surface treatment is applied on the surface thereof according to the physical properties of the first liquid LQ. In the case where, using such the first nozzle member 8, the second liquid LC separate from the first liquid LQ is made to flow through the passages 84 and 87 inside the first nozzle member 8, or a liquid immersion space is formed with the second liquid LC between the first nozzle member 8 and the substrate table 22, defects such as change in the properties of the surface of the first nozzle member 8 may occur. Moreover, in the case where, for the cleaning operation, the second liquid LC separate from the first liquid LQ is made to flow through the passages 84 and 87 inside the first nozzle member 8, or a liquid immersion space is formed with the second liquid LC between the first nozzle member 8 and the substrate table 22, when the exposure operation starts after completion of the cleaning operation, a significant amount of time may be required for the process of sufficiently removing the second liquid LC attached to the first nozzle member 8 (a process of replacing the second liquid LC with the first liquid LQ). In this case, the availability of the exposure apparatus EX may be reduced.

In the present embodiment, since the second nozzle member 9 that is dedicated for cleaning is provided, the occurrence of defects can be suppressed. Moreover, the second nozzle member 9 allows a wider selection in the types of second liquid LC that can be used.

In the present embodiment, since there is provided the ultrasonic wave generator 10 that imparts ultrasonic waves to the second liquid LC of the second liquid immersion space LS2, the cleaning effect can be enhanced. In the present embodiment, the substrate table 22 can be cleaned well as a result of a synergic effect of the second liquid LC (hydrogen solution) appropriate for cleaning, and the ultrasonic waves.

Furthermore, in the present embodiment, since the gas supply port 11 that supplies gas toward the substrate table 22 is provided, the second liquid LC on the substrate table 22 can be removed by the supplied gas, and the second liquid LC can be kept from remaining after the cleaning operation <Second Embodiment>

Next, a second embodiment is described. In the following description, the same reference symbols are given to the constituents that are the same as, or equivalent to, those of the above described embodiment, and descriptions thereof are simplified or omitted.

Figure 11:
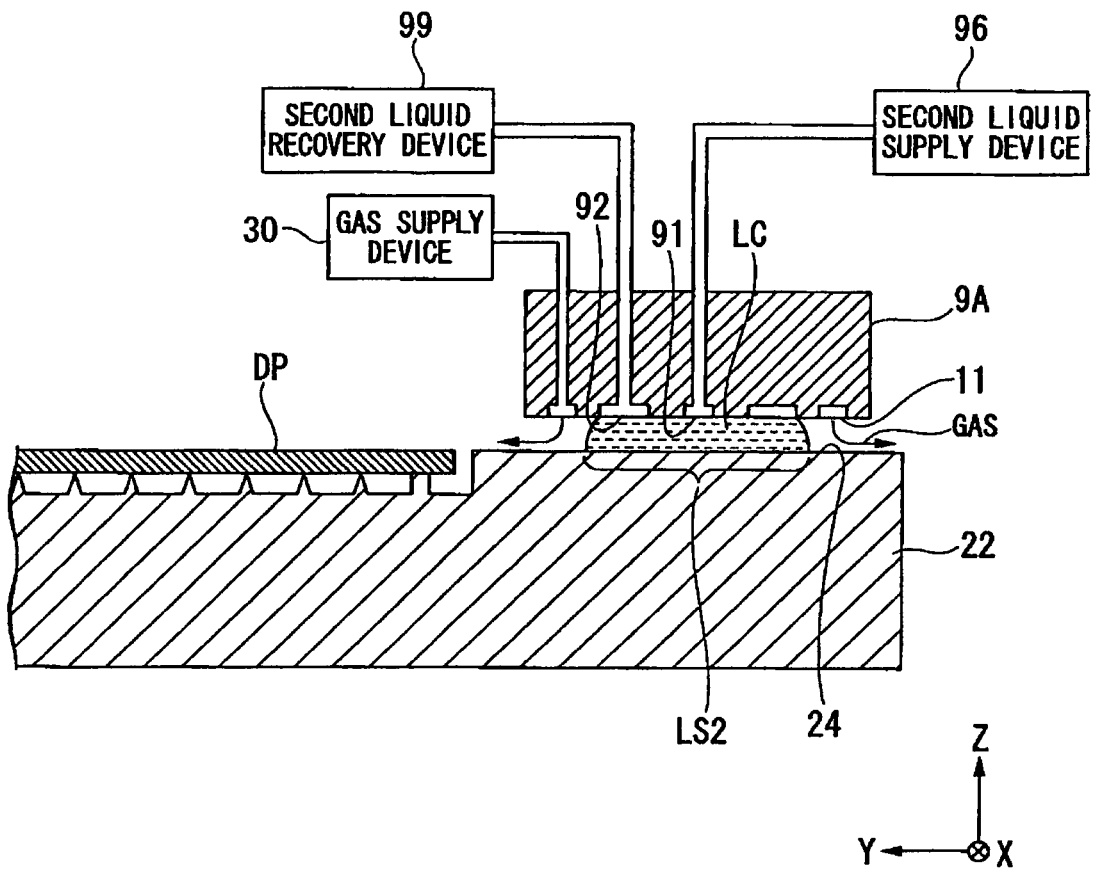
FIG. 11 is a sectional side view showing the vicinity of the second nozzle member according to a second embodiment.
Figure 12:
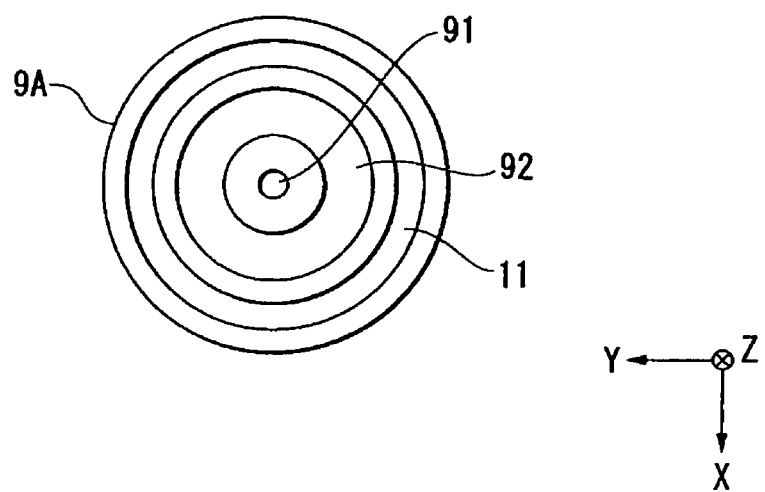
FIG. 12 is a bottom view showing the vicinity of the second nozzle member according to the second embodiment.

FIG. 11 is a side sectional view showing the vicinity of a second nozzle member 9A according to the second embodiment, and FIG. 12 is a bottom view of the second nozzle member 9A. As shown in FIG. 11 and FIG. 12, in the second embodiment, the gas supply port 11 that supplies gas toward the substrate table 22 is formed within the second nozzle member 9A for forming the second liquid immersion space LS2. That is to say, in the above mentioned first embodiment, the gas supply port 11 is formed within the third nozzle member 12, which is a separate member from the second nozzle member 9. However, in the second embodiment, the third nozzle member is omitted and the gas supply port 11 is formed within the second nozzle member 9A.

In the present embodiment, the supply port 91 that can supply the second liquid LC is formed substantially in the center of the bottom surface of the second nozzle member 9A that opposes the top surface 24 of the substrate table 22. The recovery port 92 that can recover the second liquid LC is formed in the bottom surface of the second nozzle member 9A so as to surround the supply port 91. The gas supply port 11 that supplies gas for removing the second liquid LC is formed in the bottom surface of the second nozzle member 9A so as to surround the recovery port 92.

Figure 13:
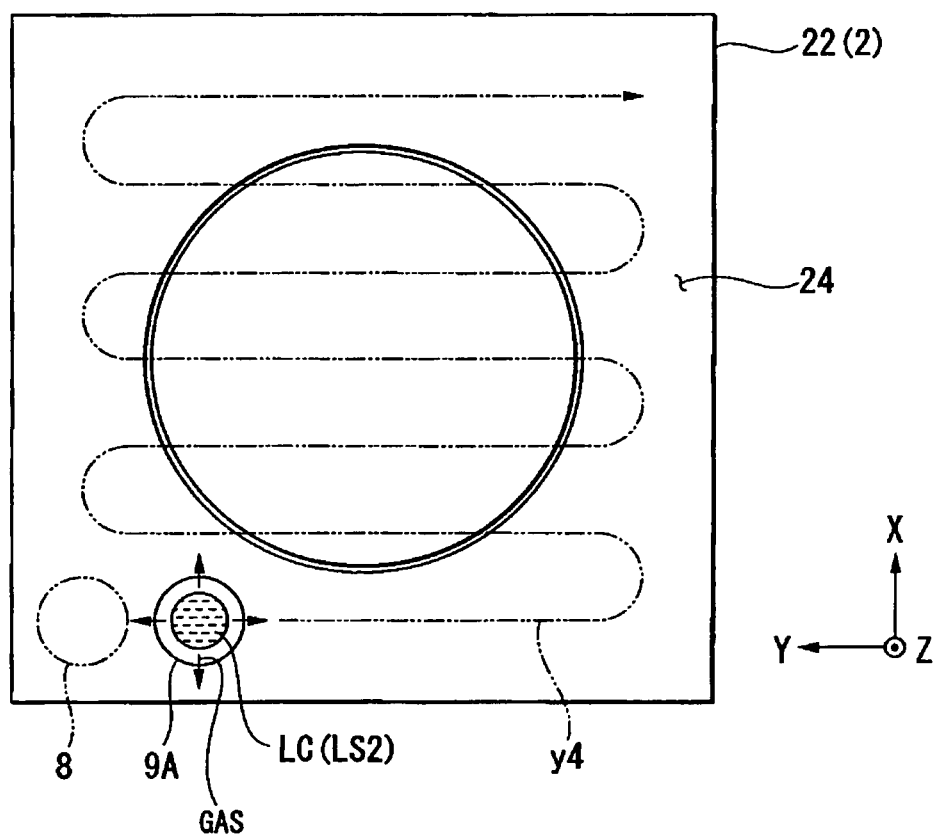
FIG. 13 is a schema for explaining an example of a cleaning method according to the second embodiment.

FIG. 13 is a schema showing an example of the cleaning operation of the substrate table 22 according to the second embodiment. As shown in FIG. 13, in the state where the second liquid immersion space LS2 has been formed below the second nozzle member 9A, the control device 7 moves the substrate table 22 with respect to the second nozzle member 9A as shown by the arrow y4 in FIG. 13. As a result, a large region of the substrate table 22 can be cleaned. Moreover, in the present embodiment, the gas supply port 11 is arranged outside the second liquid immersion space LS2, and the operation of forming the second liquid immersion space LS2 and at least some part of the operation of the gas supply from the gas supply port 11 are carried out in parallel. In the example shown in FIG. 13, since the gas supply port 11 is arranged outside the second liquid immersion space LS2 so as to surround the second liquid immersion space LS2, even when the substrate table 22 moves with respect to the second liquid immersion space LS2 in any direction on the XY plane, gas from the supply port 11 can be supplied into a region on the top surface 24 of the substrate table 22 after that region has been brought into contact with the second liquid LC of the second liquid immersion space LS2. Accordingly, in the present embodiment, a large region of the substrate table 22 can also be cleaned well, and the second liquid LC can be kept from remaining on the substrate table 22.

Figure 14:
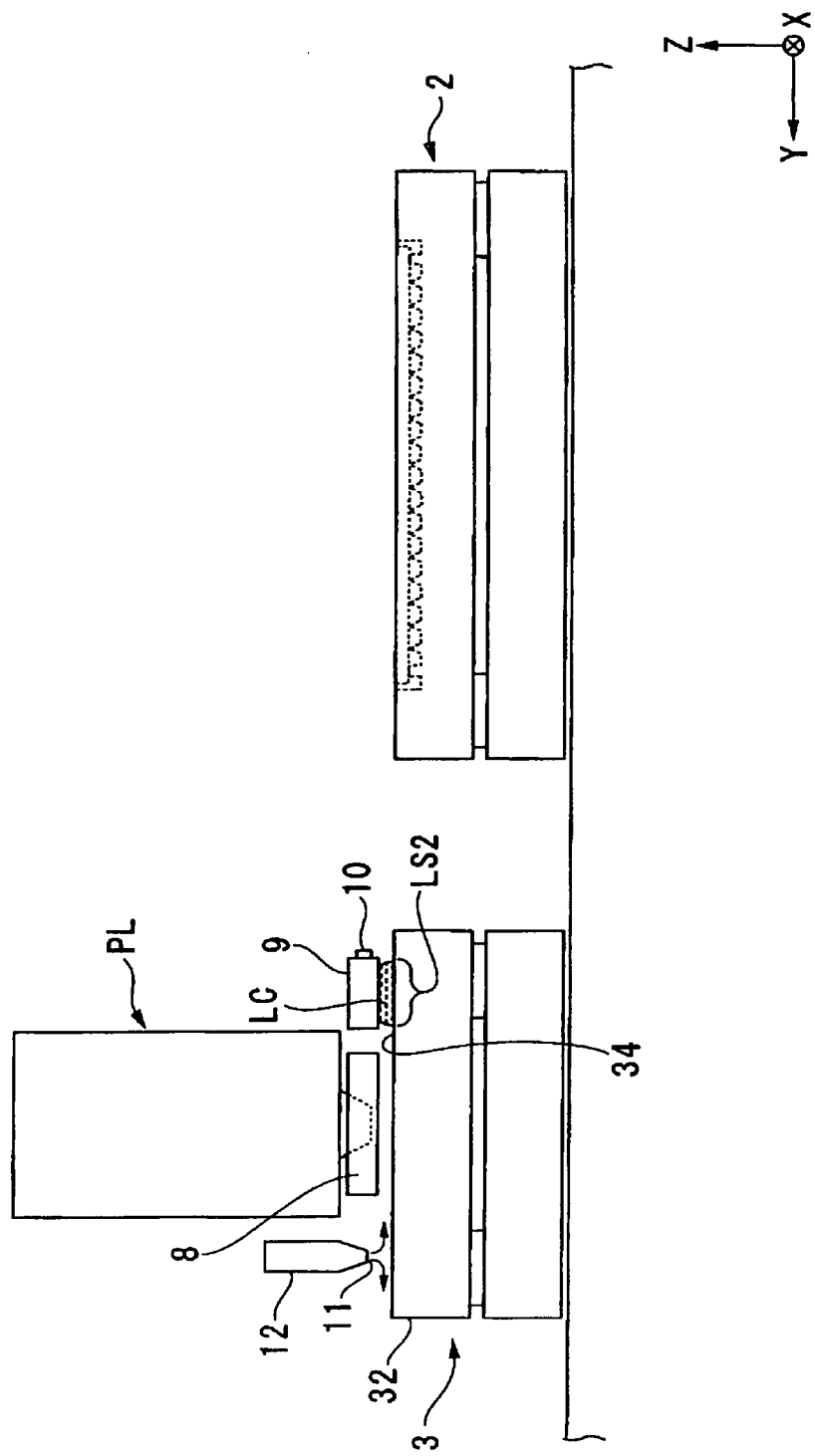
FIG. 14 is a diagram showing a status of cleaning the measurement stage.

In the above mentioned first and second embodiments, examples of carrying out cleaning of the substrate table 22 using the second liquid LC have been described. However, of course, the second nozzle member 9 and the measurement table 32 may be opposed to each other and the second liquid immersion space LS2 can be formed between the second nozzle member 9 and the measurement table 32 as shown in FIG. 14. In this case, the measurement table 32 can be cleaned well.

In the above mentioned first and second embodiments, the supply port 91 that supplies the second liquid LC, and the recovery port 92 that recovers the second liquid LC are formed in the same member (second nozzle member). However, they may be formed in separated members. For example, only the supply port 91 may be provided in the second nozzle member that can form the second liquid immersion space LS2 between the second nozzle member and the substrate table 22, and the recovery port 92 may be provided in another member separate from the second nozzle member.

Alternatively, for example, the supply port 91 that supplies the second liquid LC may be provided in another member separate from the second nozzle member that can form the second liquid immersion space LS2 between the second nozzle member and the substrate table 22. In this case, the second nozzle member has a bottom surface that opposes the top surface 24 of the substrate table 22 and is able to hold the second liquid LC between the bottom surface of the second nozzle member and the top surface 24 of the substrate table 22. The second liquid LC may be supplied into between the bottom surface of the second nozzle member and the top surface 24 of the substrate table 22 from the supply port 91 formed in another member.

In the above mentioned first and second embodiments, the recovery port 92 that recovers the second liquid LC is provided. However, the recovery port 92 may be omitted if the second liquid LC can be removed by gas supplied from the gas supply port 11.

<Third Embodiment>

Next, a third embodiment is described. In the above mentioned first and second embodiments, the ultrasonic wave generator 10 imparts ultrasonic waves to the second liquid LC of the second liquid immersion space LS2 by vibrating the second nozzle member 9. However, the third embodiment is characterized in that the ultrasonic wave generator 10 imparts ultrasonic waves (vibration) to the second liquid LC of the second liquid immersion space LS2 by vibrating the substrate table 22. In the following description, the same reference symbols are given to the constituents that are the same as or equivalent to those of the above described embodiments, and descriptions thereof are simplified or omitted.

Figure 15:
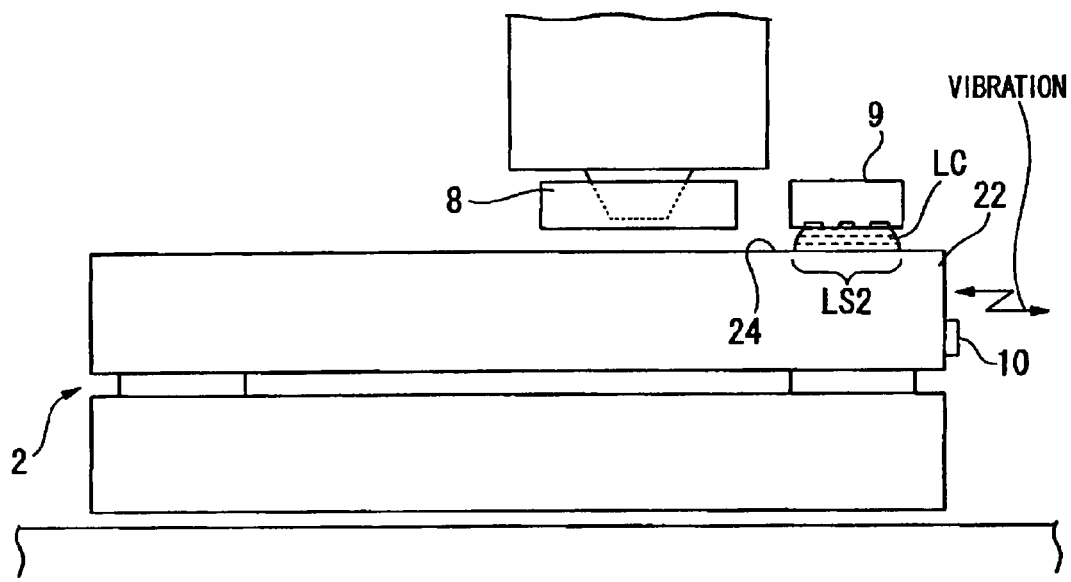
FIG. 15 is a schematic block diagram showing an exposure apparatus according to a third embodiment.

FIG. 15 is a side sectional view showing one part of the exposure apparatus EX according to the third embodiment. As shown in FIG. 15, in the present embodiment, the ultrasonic wave generator 10 has an ultrasonic oscillator connected to the substrate table 22, and it imparts ultrasonic waves to the second liquid LC of the second liquid immersion space LS2 by vibrating the substrate table 22. In the present embodiment, the ultrasonic oscillator of the ultrasonic wave generator 10 is arranged on the side surface of the substrate table 22. In the present embodiment, in the state where the second liquid immersion space LS2 has been formed, the control device 7 imparts ultrasonic waves to the second liquid LC of the second liquid immersion space LS2 while being able to move the substrate table 22 with respect to the second nozzle member 9 as shown by the respective arrows y1, y2, y3, and y4 in FIG. 9A, FIG. 9B, FIG. 10, and FIG. 13 for example. In the present embodiment, the substrate table 22 can also be cleaned well.

In the present embodiment, the substrate table 22 is vibrated in the state where the ultrasonic wave generator 10 is connected to the substrate table 22, and the second nozzle member 9 and the substrate table 22 are opposed to each other. However, ultrasonic waves may be imparted to the second liquid LC of the second liquid immersion space LS2 by vibrating the measurement table 32 with the ultrasonic wave generator 10 connected to the measurement table 32, in the state where the ultrasonic wave generator 10 is connected to the measurement table 32, the second nozzle member 9 and the measurement table 32 are opposed to each other, and the second liquid immersion space LS2 has been formed. In this case, the measurement table 32 can be cleaned well.

<Fourth Embodiment>

Next, a fourth embodiment is described. The fourth embodiment is a modified example of the above mentioned third embodiment. The fourth embodiment is characterized in that ultrasonic waves (vibration) are imparted to the second liquid LC of the second liquid immersion space LS2 by vibrating the substrate table 22 using the driving mechanism 5 that moves the substrate table 22. In the following description, the same reference symbols are given to the constituents that are same as or equivalent to those of the above described embodiments, and descriptions thereof are simplified or omitted.

Figure 16:
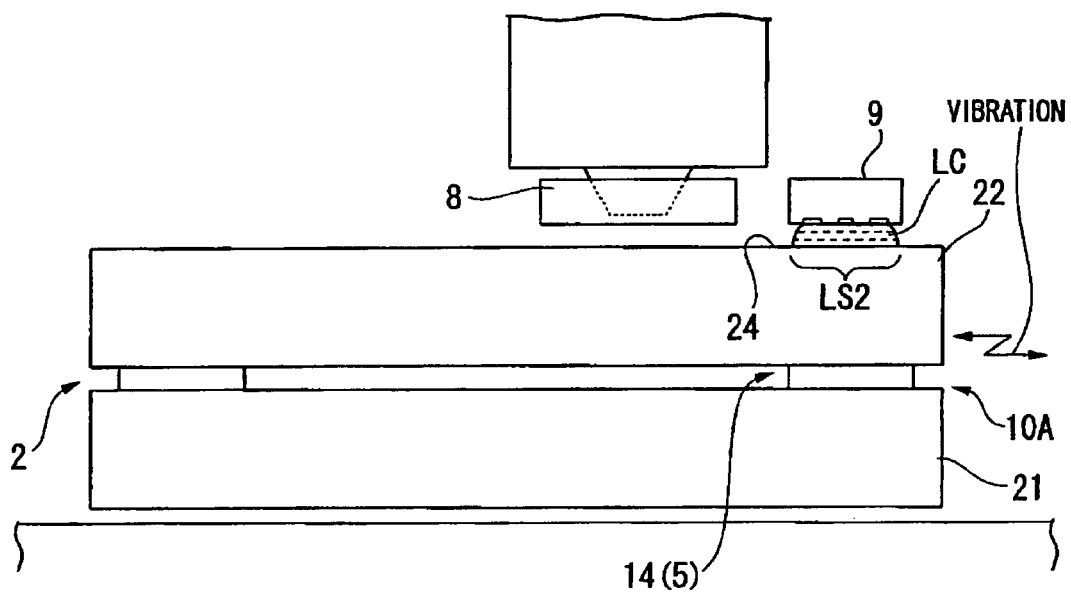
FIG. 16 is a schematic block diagram showing an exposure apparatus according to a fourth embodiment.

FIG. 16 is a side sectional view showing one part of the exposure apparatus EX according to the fourth embodiment. In the present embodiment, an ultrasonic wave generator 10A includes the driving mechanism 5 that can move the substrate table 22. In the state where the second liquid immersion space LS2 has been formed between the second nozzle member 9 and the substrate table 22, the control device 7 imparts ultrasonic waves to the second liquid LC of the second liquid immersion space LS2 by vibrating the substrate table 22 using, for example, the fine movement system 14 of the driving mechanism 5.

In the present embodiment, in the state where the second liquid immersion space LS2 has been formed, the control device 7 imparts ultrasonic waves to the second liquid LC of the second liquid immersion space LS2 by vibrating (microvibrating) the substrate table 22 on the stage main body 21 using the find adjustment system 14 while being able to move the substrate table 22 with respect to the second nozzle member 9 as shown by the respective arrows y1, y2, y3, and y4 in FIG. 9A, FIG. 9B, FIG. 10, and FIG. 13 for example, using the coarse movement system 13. In the present embodiment, the substrate table 22 can also be cleaned well.

In the present embodiment, the substrate table 22 is vibrated using the driving mechanism 5 in the state where the second nozzle member 9 and the substrate table 22 are opposed to each other. However, ultrasonic waves may be imparted to the second liquid LC of the second liquid immersion space LS2 by vibrating the measurement table 32 using the driving mechanism 5 in the state where the second nozzle member 9 and the measurement table 32 are opposed to each other, and the second liquid immersion space LS2 has been formed. In this case, the measurement table 32 can be cleaned well.

Moreover, vibration of the second nozzle member 9 may be used together with vibration of the substrate table (or measurement table 32) to impart ultrasonic waves (vibration) to the liquid of the second liquid immersion space LS2.

In the above mentioned first through fourth embodiments, the second liquid immersion space LS2 is formed with a second liquid LC that is different from the first liquid LQ. However, the second liquid immersion space LS2 may be formed with the first liquid LQ. For example, if the first liquid LQ to be used has a cleaning ability (for example, a solution other than purified water, such as fluorinated liquid) or the occurring contamination can be well removed (can be cleaned) by the first liquid LQ, the second liquid immersion space LS2 may be formed with the first liquid LQ and the substrate table 22 may be cleaned with the liquid of this second liquid immersion space LS2.

Furthermore, in the above-mentioned first through fourth embodiments, the first liquid immersion space LS1 is not maintained while executing the operation of cleaning with the second nozzle member 9. However, while the first liquid immersion space LS1 is formed with the first liquid LQ, the operation of cleaning with the second member 9 can be executed. For example, as described above, while the operation of cleaning with the second nozzle member 9 for the substrate table 22 is executed, the first liquid immersion space LS1 can be maintained by moving and placing the measurement table 32 at a position which opposes the first nozzle member 8. Alternatively, while the operation of cleaning with the second nozzle member 9 for the measurement table 32 is executed, the first liquid immersion space LS1 can be maintained by moving and placing the substrate table 22 at a position which opposes the first nozzle member 8. Alternatively, an object different from the substrate table 22 and the measurement table 32 can be placed on a position which opposes the first nozzle member 8. Thus, by maintaining the first liquid immersion space LS1 while the operation of cleaning with the second nozzle member 9 is executed, the operation of exposure for a substrate can be immediately started after the operation of cleaning.

<Fifth Embodiment>

Next, a fifth embodiment is described. In the above first through fourth embodiments, cleaning of the substrate table 22 (or the measurement table 32) is carried out in the state where the second liquid immersion space LS2 has been formed with the second liquid LC between the second nozzle member 9 and the substrate table 22 (or the measurement table 32). However, the second liquid LC may be supplied from the first nozzle member 8, and cleaning of the substrate table 22 (measurement table 32) may be carried out in the state where a liquid immersion space LS3 has been formed with the second liquid LC between the first nozzle member 8 and the substrate table 22 (measurement table 32).

In the present embodiment, in the state where the liquid immersion space LS3 has been formed with the second liquid LC between the first nozzle member 8 and the substrate table 22, ultrasonic waves (vibration) is imparted to the liquid of the liquid immersion space by vibrating the substrate table 22. In the following description, the same reference symbols are given to the constituents that are the same as or equivalent to those of the above described embodiments, and descriptions thereof are simplified or omitted.

Figure 17:
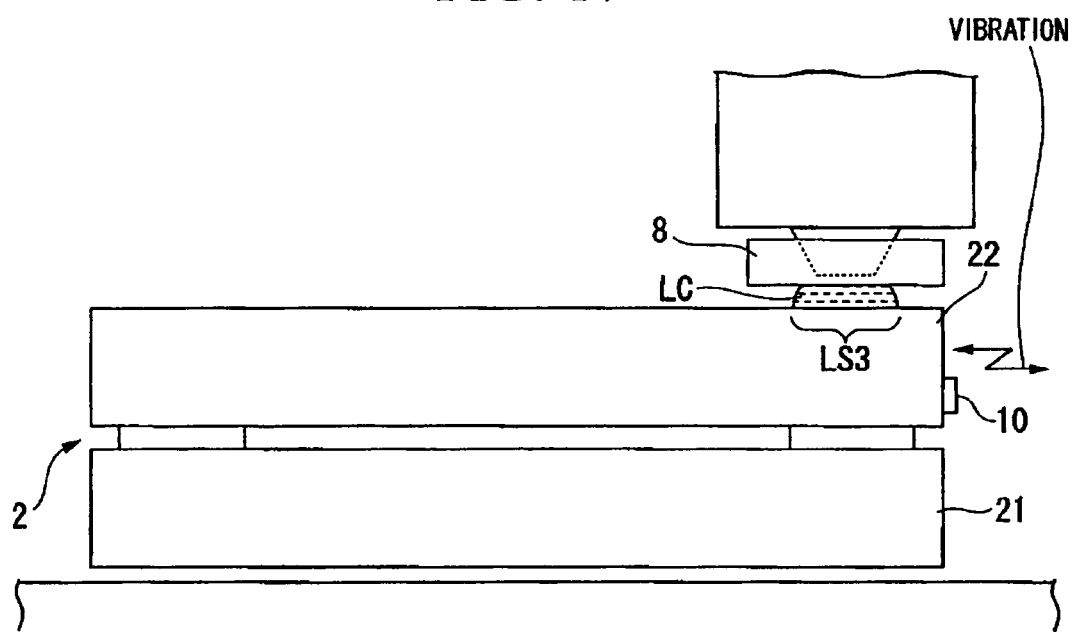
FIG. 17 is a schematic block diagram showing an exposure apparatus according to a fifth embodiment.

FIG. 17 is a side sectional view showing one part of the exposure apparatus EX according to the fifth embodiment. As shown in FIG. 17, in the present embodiment, the ultrasonic wave generator 10 has an ultrasonic oscillator connected to the substrate table 22, and it imparts ultrasonic waves to the liquid LC of the liquid immersion space LS3 formed between the substrate table 22 and the first nozzle member 8, by vibrating the substrate table 22. In the present embodiment, the ultrasonic oscillator of the ultrasonic wave generator 10 is arranged on the side surface of the substrate table 22. In the state where the liquid immersion space LS3 has been formed, the control device 7 is able to move the substrate table 22 with respect to the first nozzle member 8 while imparting ultrasonic waves to the liquid LC of the liquid immersion space LS3. In the present embodiment, the substrate table 22 can also be cleaned well.

Moreover, in the present embodiment, the first nozzle member 8 (for example, the bottom surface thereof) and/or the terminal optical element FL (for example, the light emitting surface thereof) can be cleaned. Therefore, the first liquid immersion space LS1 can be formed using the first nozzle member 8 that has been cleaned, so as to fill the optical path space for the exposure light EL with the first liquid LQ. In the case where the substrate table 22 is not the target of cleaning, the substrate table 22 may be vibrated in the state where the dummy substrate DP held by the substrate table 22 opposes the first nozzle member 8 and/or the terminal optical element FL.

In the present embodiment, the liquid immersion space LS3 may be formed with the first liquid LQ. For example, if the first liquid LQ to be used has a cleaning ability (for example, fluorinated liquid) or the occurring contamination can be well removed (can be cleaned) by the first liquid LQ, cleaning can be carried out well with the first liquid LQ.

In the present embodiment, the substrate table 22 is vibrated in the state where the ultrasonic wave generator 10 is connected to the substrate table 22, and the first nozzle member 8 and the substrate table 22 are opposed to each other. However, ultrasonic waves may be imparted to the liquid LC of the liquid immersion space LS3 by vibrating the measurement table 32 with the ultrasonic wave generator 10 connected to the measurement table 32 in the state where the ultrasonic wave generator 10 is connected to the measurement table 32, the first nozzle member 8 and the measurement table 32 are opposed to each other, and the liquid immersion space LS3 has been formed. In this case, at least any one of the measurement table 32, the first nozzle member 8, and the terminal optical element FL can be cleaned well.

<Sixth Embodiment>

Next, a sixth embodiment is described. The sixth embodiment is a modified example of the above mentioned fifth embodiment. The sixth embodiment is characterized in that ultrasonic waves (vibration) are imparted to the liquid of a liquid immersion space between the first nozzle member 8 and the substrate table 22 by vibrating the substrate table 22 using the driving mechanism 5 that moves the substrate table 22. In the following description, the same reference symbols are given to the constituents that are the sane as or equivalent to those of the above described embodiments, and descriptions thereof are simplified or omitted.

Figure 18:
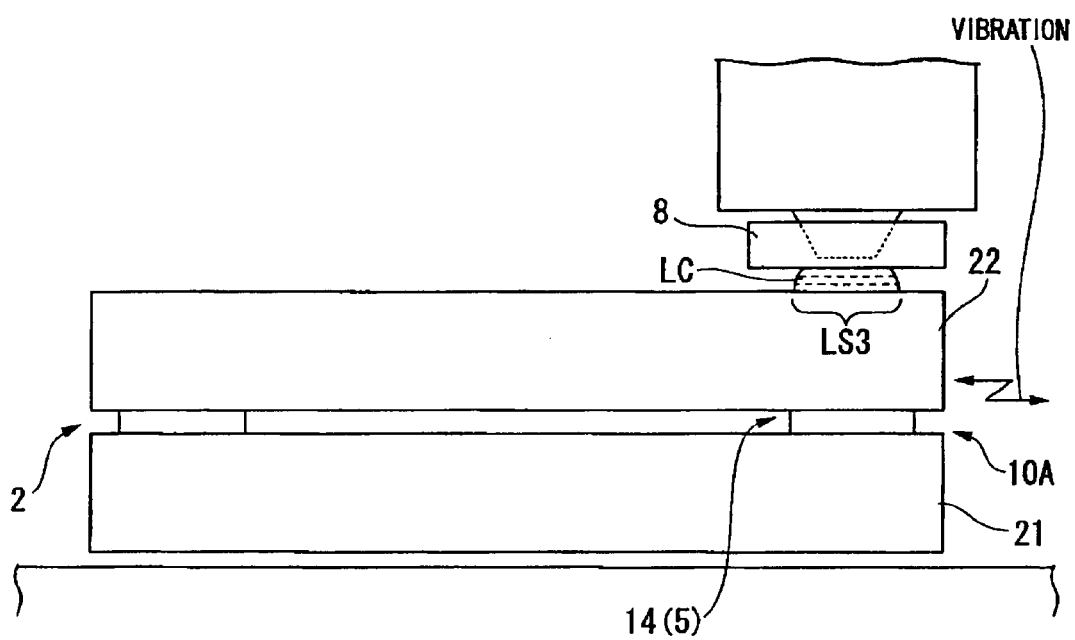
FIG. 18 is a schematic block diagram showing an exposure apparatus according to a sixth embodiment.

FIG. 18 is a side sectional view showing one part of the exposure apparatus EX according to the sixth embodiment. In the present embodiment, an ultrasonic wave generator 10A includes the driving mechanism 5 that can move the substrate table 22. In the state where the liquid immersion space LS3 has been formed between the first nozzle member 8 and the substrate table 22, the control device 7 imparts ultrasonic waves to the liquid LC of the liquid immersion space LS3 formed between the first nozzle member 8 and the substrate table 22 by vibrating the substrate table 22 using, for example, the fine movement system 14 of the driving mechanism 5. As with the above fifth embodiment, the liquid immersion space LS3 may be formed with the first liquid LQ.

In the present embodiment, in the state where the liquid immersion space LS3 has been formed, the control device 7 is able to move the substrate table 22 with respect to the first nozzle member 8 using the coarse movement system 13 while imparting ultrasonic waves to the liquid LC of the liquid immersion space LS3 by vibrating (micro-vibrating) the substrate table 22 on the stage main body 21 using the fine movement system 14. Also in the present embodiment, at least any one of the measurement table 22, the first nozzle member 8, and the terminal optical element FL can be cleaned well.

In the present embodiment, the substrate table 22 is vibrated using the driving mechanism 5 in the state where the first nozzle member 8 and the substrate table 22 are opposed to each other. However, ultrasonic waves may be imparted to the liquid LC of the liquid immersion space LS3 by vibrating the measurement table 32 using the driving mechanism 5 in the state where the first nozzle member 8 and the measurement table 32 are opposed to each other and the liquid immersion space LS3 has been formed. In this case, at least any one of the measurement table 32, the first nozzle member 8, and the terminal optical element FL can be cleaned well.

In the above fifth and sixth embodiments, the first liquid LQ and the second liquid LC different from the first liquid LQ may be used sequentially in time to form the liquid immersion space LS3 between the first nozzle member 8 and the substrate table 22 (or the measurement table 32). In the case where the first liquid LQ is water (purified water) and the second liquid LC is dissolved gas control water (such as hydrogen water, nitrogen water), in which a predetermined gas is dissolved in water, the cleaning operation that uses the first liquid LQ can be carried out after the cleaning operation that uses the second liquid. An amount of time required for the process of replacing with the first liquid LQ after completion of the cleaning operation can be thereby reduced.

Moreover, in the above fifth and sixth embodiments, ultrasonic waves (vibration) may be imparted to the liquid of the liquid immersion space LS3 by vibrating the first nozzle member 8. In this case, the substrate table 22 (or the measurement table 32) that opposes the first nozzle member 8 may either be vibrated or not be vibrated.

Furthermore, in the above fifth and sixth embodiments, the second nozzle member 9 may be omitted, or the exposure apparatus EX may be made able to carry out both the cleaning operation that uses the first nozzle member 8 and the cleaning operation that uses the second nozzle member 9.

In the above third through to sixth embodiments, in the state where the nozzle members (8 and 9) are not arranged in the position that opposes the top surface of the substrate table 22 (or the measurement table 32) and a liquid immersion space (liquid immersion region) of liquid is formed on the substrate table 22, ultrasonic waves may be imparted to the liquid of the liquid immersion space (liquid immersion region) by vibrating the substrate table 22 (or the measurement table). Thereby, the substrate table 22 (or the measurement table) can also be well cleaned using the liquid and ultrasonic wave.

Furthermore, in the above first through sixth embodiments, a vibration (ultrasonic wave) of 20 KHz or above is imparted to the liquid (LQ or LC) in order to promote cleaning of the object such as the substrate table 22. However, a vibration below 20 KHz may be imparted to the liquid LQ.

Figure 19:
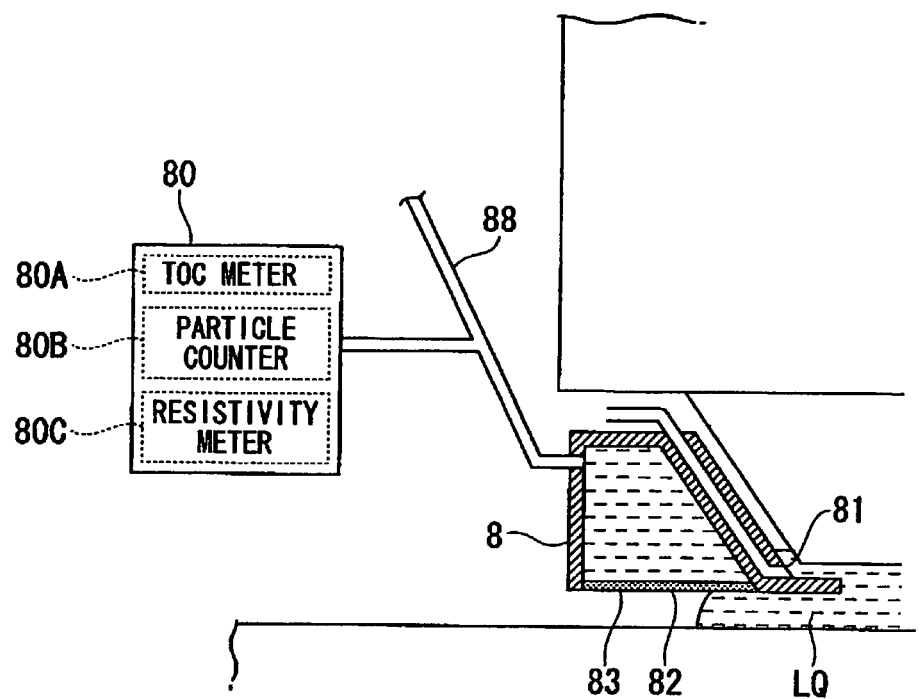
FIG. 19 is a diagram showing a status of detecting a contamination status of the substrate table.

In the above first through sixth embodiments, whether or not the cleaning operation is carried out is determined based on the detection result from the alignment system 40 having the image-capturing device. However, since the exposure apparatus EX is provided with the detection device 80 that can detect the quality (water quality) of the first liquid LQ recovered by the recovery port 82 as described above, whether or not the cleaning operation is carried out may be determined based on the detection result from the detection device 80. As shown in FIG. 19, the detection device 80 includes a TOC meter 80A for measuring total organic carbon in the first liquid LQ, a particle counter 80B for measuring substances including fine particles and bubbles, and a resistivity meter 80C for measuring the resistivity of the first liquid LQ, and it is able to detect the contamination state of the first liquid LQ that has been brought into contact with the substrate table 22 (or the measurement table 32) and that has been recovered by the recovery port 82. Therefore, the control device 7 may carry out the cleaning operation when the first liquid LQ that has been in contact with the substrate table 22 is determined to be contaminated based on the detection result of the detection device 80. Since the contamination state of the first liquid LQ that has been in contact with the substrate table 22 changes according to the contamination state of the substrate table 22, by detecting the contamination state of the first liquid LQ recovered by the recovery port 82 using the detection device 80 after it has been brought into contact with the substrate table 22, the control device 7 can find (estimate) the contamination state of the substrate table 22 based on the result of this detection. When the control device 7 has determined, based on the detection result of the detection device 80, that the contamination state of the substrate table 22 is not within the allowable range, it stops the exposure operation and carries out the cleaning operation.

Moreover, in the case where the quality of the liquid LQ is detected by the detection device 80 while moving the substrate table 22 with respect to the first liquid immersion space LS1, the detection results from the detection device 80 may vary among the positions of the substrate table 22 with respect to the first liquid immersion space LS1. For example, in the case where the detection result from the detection device 80 when the first liquid immersion space LS1 is formed between a first region of the substrate table 22 and the first nozzle member 8 differs from the detection result from the detection device 80 when the first liquid immersion space LS1 is formed between a second region of the substrate table 22 and the first nozzle member 8, the difference can be determined between the contamination state of the first region and the contamination state of the second region of the substrate table 22. Moreover, based on the detection result from the detection device 80, it can be determined whether or not one region is more contaminated than the other region on the substrate table 22. The control device 7 can carry out intensive cleaning for this contaminated region. Moreover, in the case where the quality of the liquid LQ is detected by the detection device 80 while moving the substrate table 22 with respect to the first liquid immersion space LS1, if the detection results from the detection device 80 do not significantly vary among the positions of the substrate table 22 with respect to the first liquid immersion space LS1 even when the detected liquid LQ is contaminated, it can be determined that the first nozzle member 8 (the recovery port 82, porous member 83) is contaminated. Moreover, by detecting the contamination state of the liquid LQ by the detection device 80 in the state where the first liquid immersion space LS1 has been formed on the highly clean dummy substrate DP, it can be determined that the first nozzle member 8 (the recovery port 82, porous member 83) is contaminated.

Figure 20A:
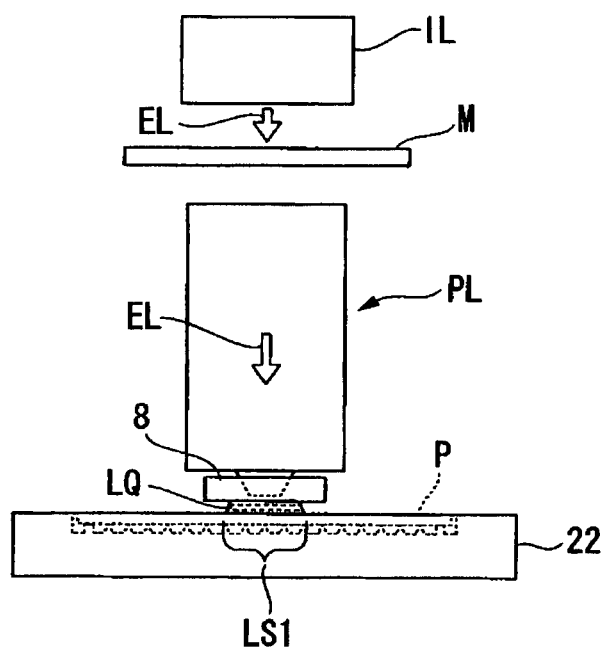
FIG. 20A is a diagram showing a status of detecting a contamination status of the substrate table.
Figure 20B:
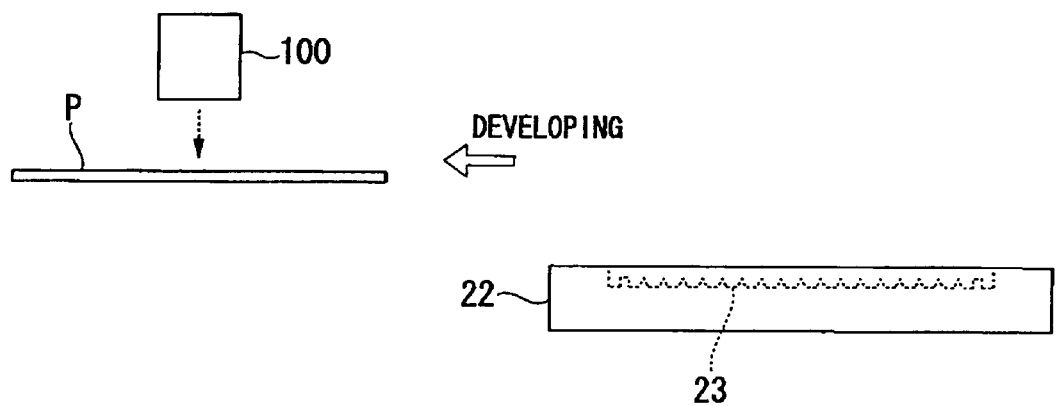
FIG. 20B is a diagram showing a status of detecting a contamination status of the substrate table.

After the exposure substrate P has been exposed with the pattern image of the mask M and has been subjected to image development as shown in FIG. 20A, the shape of the pattern formed on the exposure substrate P is measured by a predetermined measurement device 100 as shown in FIG. 20B, and whether or not the cleaning operation is carried out may be determined based on that measurement result. For example, if no pattern defects are determined within the allowable range based on the result of pattern shape measurement, then the control device 7 determines the contamination state of the substrate table 22 to be outside the allowable range and carries out the cleaning operation.

Figure 21A:
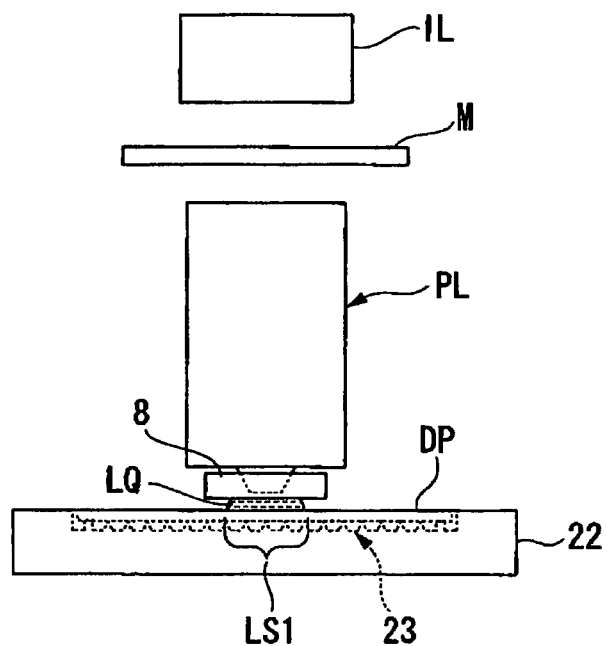
FIG. 21A is a diagram showing a status of detecting a contamination status of the substrate table.
Figure 21B:
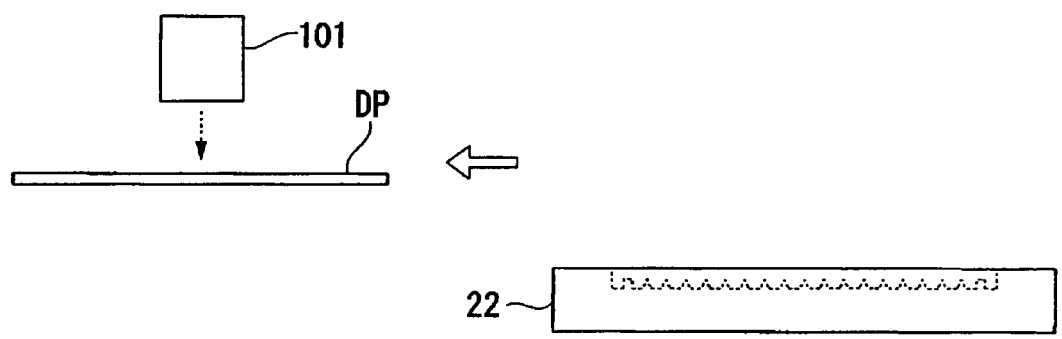
FIG. 21B is a diagram showing a status of detecting a contamination status of the substrate table.

Moreover, it may be such that in the state where the highly clean dummy substrate DP is held by the holding section 23 of the substrate table 22, the first liquid immersion space LS1 has been formed on the dummy substrate DP being held and the first liquid immersion space LS1 has been formed between the first nozzle member 8 and the dummy substrate DP as shown in FIG. 21A, and the dummy substrate DP is unloaded from the substrate table 22 as shown in FIG. 21B after the substrate table 22 (substrate stage 2) has moved in the movement path similar to that of the usual exposure sequence, the contamination state of the dummy substrate DP is detected by a predetermined detection device 101, and whether or not the cleaning operation is to be carried out is determined based on the detection result. Exposure light is not irradiated onto the dummy substrate while moving the substrate table 22 in the state where the fit liquid immersion space LS1 has been formed between the first nozzle member 8 and the dummy substrate DP.

By carrying out the above operation, the contamination state of the substrate table 22 or the first nozzle member 8 can be detected by the detection device 101. Since the contamination state of the dummy substrate DP (an amount of contaminant attached to the dummy substrate DP) when the above operation has been carried out varies depending on the contamination state of the substrate table 22, by detecting the contamination state of the dummy substrate DP by the predetermined detection device 101, the contamination state of the substrate table 22 and so forth can be found (estimated) based on the detection result. The control device 7 can determine whether or not the cleaning operation is to be carried out based on the detection result of the detection device 101.

Figure 22:
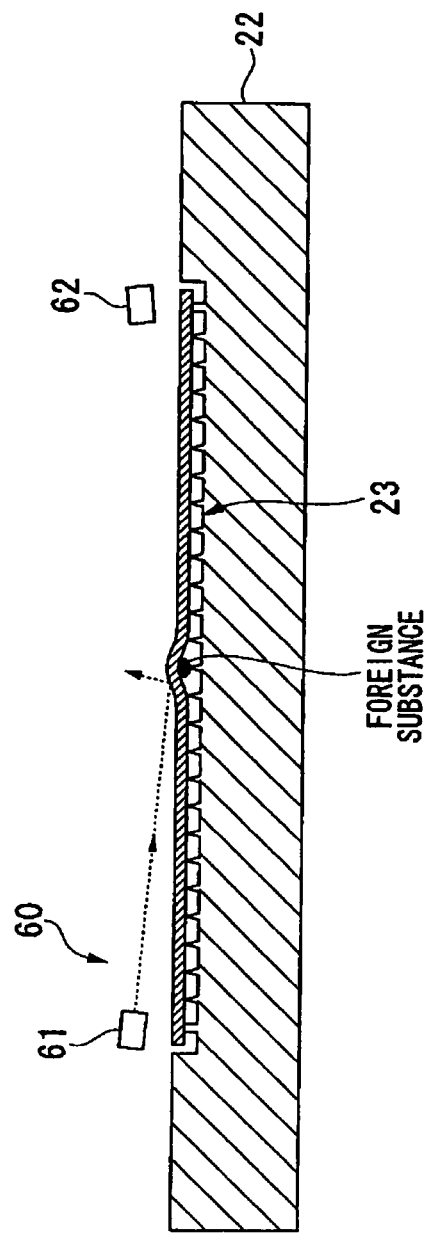
FIG. 22 is a diagram showing a status of detecting a contamination status of the substrate table.

Moreover, as shown in FIG. 22, it may be such that the dummy substrate DP having a highly flat surface is held by the holding section 23 of the substrate table 22, the shape (flatness) of the surface of the dummy substrate DP is detected by the oblique incidence type focus leveling detection system 60 having the projection device 61 and the light receiving device 62 mentioned above, and whether or not the cleaning operation is to be carried out is determined based on the detection result. As shown in FIG. 22, since the shape (flatness) of the surface of the dummy substrate DP is degraded in the case where a contaminant (foreign substance) is present on the holding section 23, if the degree of the deterioration is determined to be outside the allowable range, the control device 7 determines that the contamination state of the substrate table 22 is also outside the allowable range and carries out the cleaning operation.

It may be such that the dummy substrate DP is not held by the holding section 23 and the projection device 61 directly irradiates detection light onto the holding section 23. Based on the light receiving result of the light receiving device 62 at this time, the control device 7 can detect the contamination state of the substrate table 22.

Furthermore, without a detection of the contamination state as described above, the cleaning operation may be carried out at every predetermined number of exposures of the substrates P, at every lot, or at every predetermined interval.

<Seventh Embodiment>

Next, a seventh embodiment is described. In the following description, the same reference symbols are given to the constituents that are the same as or equivalent to those of the above described embodiments, and descriptions thereof are simplified or omitted.

Figure 23:
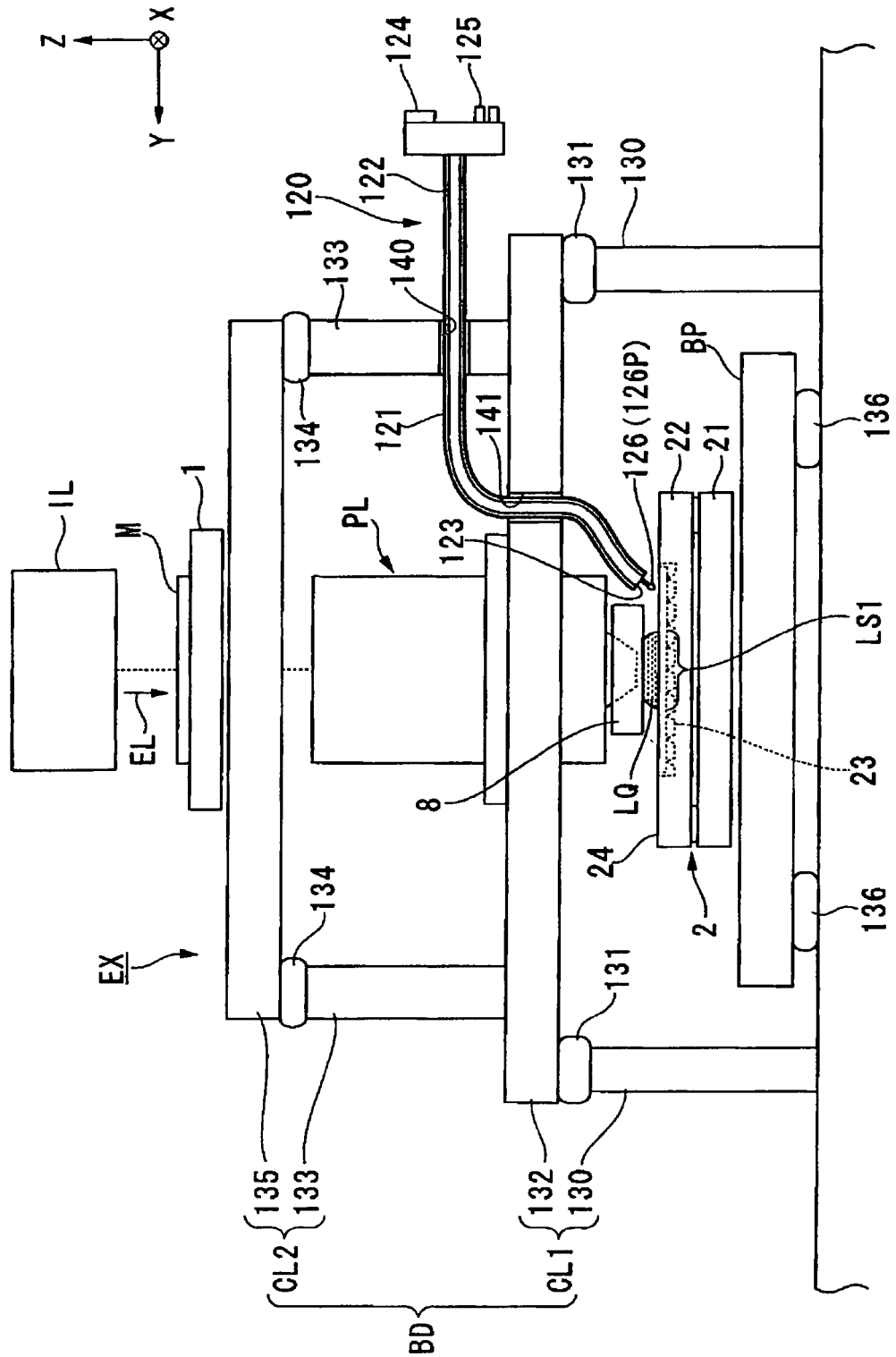
FIG. 23 is a schematic block diagram showing an exposure apparatus according to a seventh embodiment.

FIG. 23 is a schematic block diagram showing the exposure apparatus EX according to the seventh embodiment. The exposure apparatus EX is provided with a detection device 120 that can detect the contamination state of the substrate table 22. In the present embodiment, the detection device 120 is provided with a bendable bent member (flexible member) 121, a driving device 122 that bends the bent member 121, and an observation device 123 that is provided on the tip end side (distal end side) of the bent member 121 and that enables observation of the contamination state of the substrate table 22 having been in contact with the liquid LQ.

The bent member 121 has a fiberscope. The driving device 122 is provided with a plurality of wires, with one end thereof being connected to the distal end of the bent member 121, and the other end being connected to a rotating body with an actuator (motor) that is able to rotate the rotating body. As the actuator rotates the rotating body, the wires are driven and the bent member 121 is bent. The observation device 123 has an optical system arranged on the distal end of the bent member 121 and an image-capturing device that obtains an optical image (image) via this optical system. In the following description, the detection device 120 according to the present embodiment is appropriately referred to as an endoscope device 120.

Furthermore, the endoscope 120 is provided with an output device 124 that is provided on the rear end side (base end side) of the bent member 121 and that outputs an observation result of the observation device 123. The output device 124 includes a display device and the like. Moreover, in the present embodiment, the endoscope device 120 is provided with an operating device that is provided on the rear end side of the bent member 121 and that operates the driving device 122.

In the present embodiment, the endoscope device 120 is provided with a cleaning device 126 that is provided on the distal end side of the bent member 121 and that is able to clean the substrate, table 22, and a driving device that is able to drive the cleaning device 126. The operating device 125 can operate the cleaning device 126.

In FIG. 23, the exposure apparatus EX is provided with a body BD including a first column CL1 provided, for example, on the floor surface in a clean room, and a second column CL2 provided on the first column CL1. The first column CL1 is provided with a plurality of first support posts 130 and a lens barrel surface plate 132 supported on these first support posts 130 via antivibration devices 131. The second column CL2 is provided with a plurality of second support posts 133 provided on the lens barrel surface plate 132 and a base member 135 supported on these second support posts 133 via antivibration devices 134. The mask stage 1 is movable on the base member 135. The substrate stage 2 is movable on a base member BP. The base member BP is supported on the floor surface via antivibration devices 136. Each of the antivibration devices 131, 134, and 136 includes an active antivibration device provided with a predetermined actuator and a damper mechanism.

In FIG. 23, the measurement stage is not shown.

In predetermined positions of the body BD there are formed apertures (holes) 140 and 141 into which at least one part of the endoscope device 120 can be arranged. The bent member 121 of the endoscope device 120 can be inserted into the apertures 140 and 141 from outside of the body BD, and the distal end of the bent member 121 can be brought into the close vicinity of the substrate table 22. The output device 124 and the operating device 125 arranged on the rear end of the bent member 121 are arranged outside the body BD. By inputting an operating signal to the operating device 125 arranged outside the body BD, the driving device 122 is driven to actuate the bent member 121 and the cleaning device 126 is actuated.

The cleaning device 126 includes a pad member 126P. The pad member 126P is formed from non-woven fabric for example. The pad member 126P may be a grinding stone form member. The endoscope device 120 is able to remove contaminant on the substrate table 22 by pressing the pad member 126 against the substrate table 22 or by rubbing the substrate table 22 with the pad member 126P.

Next, a cleaning method according to the present embodiment is described. As with the above embodiments, the control device 7 detects the contamination state of the substrate table 22 with the alignment system 40 or the like at every predetermined number of exposures of the substrates P, at every lot, or at every predetermined interval. The control device 7 controls the cleaning operation for the substrate table 22 based on the detection result of the contamination state of the substrate table 22 from the alignment system 40 or the like. Based on the detection result from the alignment system 40 or the like, if the contamination state of the top surface 24 of the substrate table 22 is determined to be outside the allowable range, then the control device 7 starts the cleaning operation using the endoscope device 120.

Figure 24:
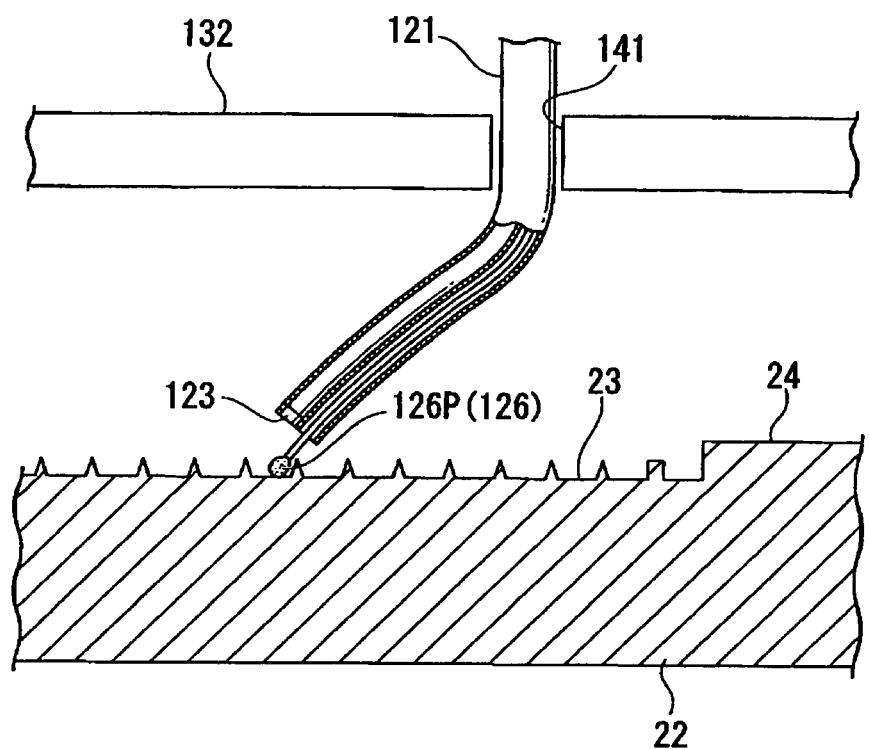
FIG. 24 is an enlarged view showing a part of an endoscope apparatus according to the seventh embodiment.

The control device 7 controls the driving device 122 of the endoscope device 120 to bring the distal end of the bent member 121 into the close vicinity of the substrate table 22. The control device 7 monitors the contaminant on the substrate table 22 using the observation device 123 of the endoscope device 120, while adjusting the positional relationship of the cleaning device 126 (the pad member 126P) to the contaminant and driving the cleaning device 126 to remove the contaminant as shown in FIG. 24. As a result, the substrate table 22 (holding section 23 and/or top face 24) is cleaned.

The case where the endoscope device 120 is controlled by the control device 7 has been described here. However, since the endoscope device 120 has the output device 124 and the operating device 125 as described above, a cleaning operation may be carried out where an operator monitors the observation result of the observation device 123 with the output device 124 while operating the bent member 121 of the endoscope device 120 inserted into the apertures 140 and 141, and operating the cleaning device 126.

Here, the case where the contamination state of the substrate table 22 is detected using the alignment system 40 or the like, and the cleaning operation using the endoscope device 120 is carried out based on this detection result has been described. However, cleaning of the substrate table 22 may be carried out such that without using the alignment system 40 or the like, the bent member 121 of the endoscope device 120 is inserted into the apertures 140 and 141 at every predetermined number of exposures of the substrates P, at every lot, or at every predetermined interval to observe the substrate table 22 using the observation device 123 provided on the distal end side of the bent member 121, and if the substrate table 22 is determined to be contaminated based on the observation result, then the cleaning device 126 provided on the distal end side of the bent member 121 is actuated. In this case, the actuation of the cleaning device 126 may be carried out by the control device 7 or may be carried out by an operator.

The cleaning device 126 may have a tweezers device that can pinch a contaminant (foreign substance), and is not limited to having the pad member 126P. By actuating the tweezers device the contaminant (foreign substance) can be removed.

In the present embodiment, the case where the endoscope device 120 cleans the substrate table 22 (the holding section 23) has been described as an example. However, the endoscope device 120 can also clean the measurement table 32 of the measurement stage 3 as well as the first nozzle member 8. Moreover, if the exposure apparatus EX is provided with the second nozzle member 9 described in the above embodiments, the endoscope device 120 can clean the second nozzle member 9. Furthermore, the endoscope device 120 can clean all members that construct the exposure apparatus EX including the stage main body 21 of the substrate stage 2, the stage main body 21 of the measurement stage 3, the base member BP and so forth if the cleaning device 126 on the distal end of the bent member 121 can be brought into the close vicinity of these members.

<Eighth Embodiment>

Next, an eighth embodiment is described. The present embodiment is characterized in that cleaning is carried out using a cleaning member. In the following description, the same reference symbols are given to the constituents that are the same as or equivalent to those of the above described embodiments, and descriptions thereof are simplified or omitted.

Figure 25:
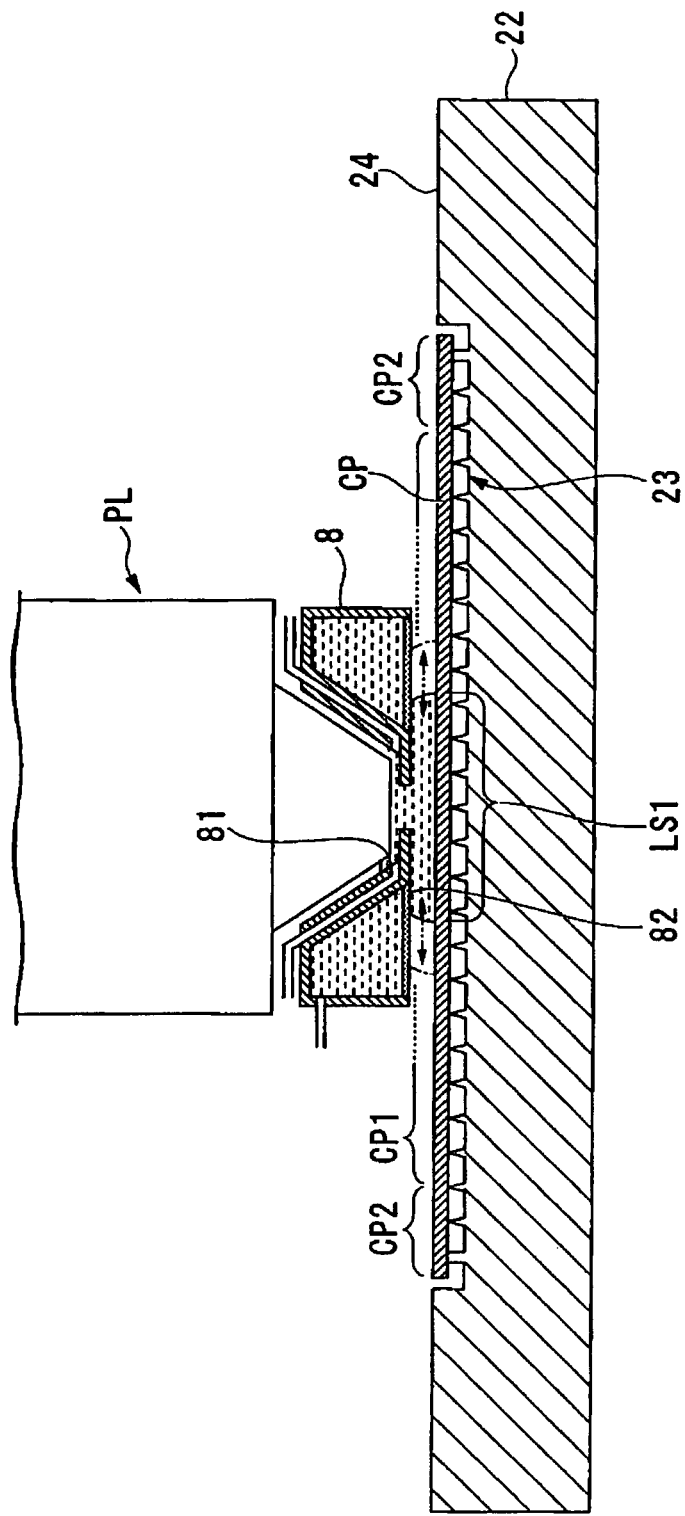
FIG. 25 is a schema for explaining an example of a cleaning method according to an eighth embodiment.

FIG. 25 is a schema showing a cleaning member CP according to the eighth embodiment. The cleaning member CP is a plate form member (disk form member) with an outer shape similar to that of the exposure substrate P, and is detachably held by the holding section 23 of the substrate table 22 that is able to hold the exposure substrate P. The cleaning member CP held by the substrate table 22 can be arranged in a position that opposes the first nozzle member 8 which is able to form the liquid immersion space LS1 of the liquid LQ.

In the present embodiment, the cleaning member CP is formed from glass material such as quartz.

Next, an example of the cleaning operation that uses the cleaning member CP is described. As shown in FIG. 25, after the cleaning member CP has been held by the holding section 23 of the substrate table 22, the control device 7 forms the liquid immersion space LS1 of the liquid LQ between the first nozzle member 8 and the cleaning member CP.

Figure 26:
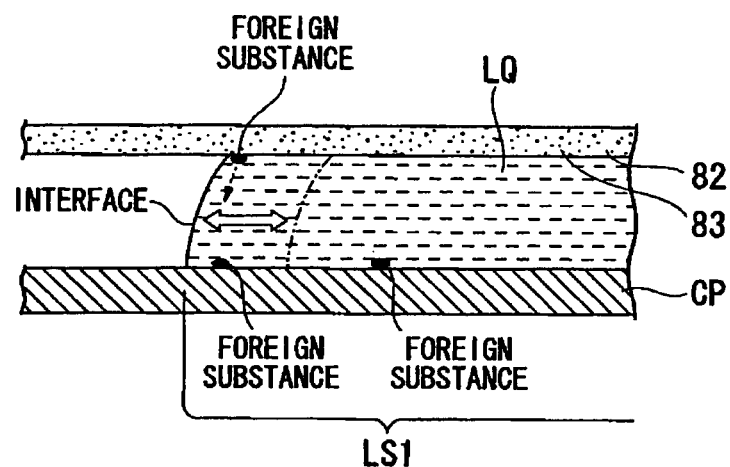
FIG. 26 is a schema for explaining an example of the cleaning method according to the eighth embodiment.

The control device 7 adjusts either an amount of liquid to be supplied from the supply port 81 of the first nozzle member 8 in a unit of time or an amount of liquid to be recovered by the recovery port 82, to move the interface of the liquid immersion space LS1. As shown in the schema of FIG. 26, by moving the interface of the liquid immersion space LS1, foreign substances attached to the bottom surface of the first nozzle member 8 including the bottom surface of the porous member (mesh) 83 arranged in the recovery port 82 are removed from the first nozzle member 8.

The foreign substances that have been removed from the first nozzle member 8 are held on the surface of the cleaning member CP on the substrate table 22 opposing the first nozzle member 8. That is to say, the cleaning member CP opposes the first nozzle member 8 and holds the foreign substances that have been removed from the first nozzle member 8, in the state of being held by the substrate table 22.

The cleaning member CP is able to hold the foreign substances that have been removed from the first nozzle member 8 with electrostatic force. For example, if the zeta potential of the foreign substance is positive, then the cleaning member CP is charged negative and this cleaning member CP can hold the foreign substance well. In the present embodiment, the cleaning member CP is formed from glass material and is able to hold foreign substances well with electrostatic force. Moreover, as the cleaning member CP holds the foreign substances well, the foreign substances held on the surface of the cleaning member CP are kept from becoming attached to the bottom surface of the first nozzle member 8 again. As a result, the cleaning member CP can hold the foreign substances that have been removed from the first nozzle member 8 in the cleaning operation using the liquid LQ.

Here, in the present embodiment, the cleaning member CP has a holding region CP1 that is able to hold foreign substances with electrostatic force, and a liquid repellent region CP2. Specifically, the surface of the cleaning member CP opposing the first nozzle member 8 has the holding region CP1 able to hold the foreign substances that have been removed from the first nozzle member 8 with electrostatic force, and has the liquid repellent region CP2 formed so as to surround the holding region CP1. The holding region CP1 is formed from a glass surface, and the liquid repellent region CP2 is formed from a glass surface coated with a film material having liquid repellent properties such as fluorinated resin including polytetrafluoroethylene (Teflon (registered trademark)) or acrylic resin.

Figure 27:
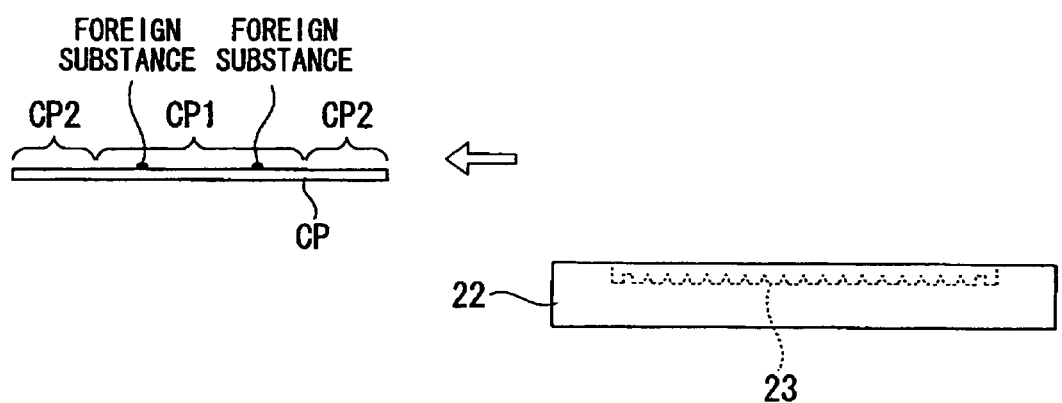
FIG. 27 is a schema for explaining an example of the cleaning method according to the eighth embodiment.

Having carried out the operation of moving the interface of the liquid immersion space LS1 for a predetermined period of time, the control device 7 removes the liquid immersion space LS1 from the cleaning member CP, and unloads the cleaning member CP from the substrate table 22 using the predetermined carrying device as shown in the schema of FIG. 27. The cleaning member CP is unloaded from the substrate table 22 while holding the foreign substances. In the holding region CP1 on the surface of the cleaning member CP where the foreign substances are held with electrostatic force, there may be a liquid film, liquid drop and so forth present. However, since the liquid repellent region CP2 is formed so as to surround this holding region CP1, this liquid repellent region CP2 keeps the liquid on the holding region CP1 from exiting to outside the liquid repellent region CP2. Therefore, the liquid is suppressed from exiting from the cleaning member CP while the cleaning member CP is carried for example. As a result, the foreign substances attached to the bottom surface of the first nozzle member 8 are removed and these foreign substances together with the cleaning member CP can be unloaded to outside the exposure apparatus EX.

As a method of moving (vibrating) the interface of the liquid immersion space LS1, vibration may be imparted to the liquid used for the cleaning operation as with the first through sixth embodiments mentioned above.

In the present embodiment, the case of removing the foreign substances on the first nozzle member 8 has been described. However, in the case where the exposure apparatus EX has the second nozzle member 9 described in the above embodiments, an operation of removing foreign substances on the second nozzle member 9 can be carried out using the cleaning member CP.

Obviously, the cleaning operation and the cleaning mechanism described in the first through eighth embodiments mentioned above can be used appropriately in combination.

In the abovementioned first through eighth embodiments, the optical path space on the light emitting side (image plane side) of the terminal optical element of the projection optical system is filled with the liquid. However, as disclosed in PCT International Publication No. WO2004/019128, a projection optical system can also be employed where the optical path space on the light incident side (object face side) of the terminal optical element is also filled with the liquid.

The first liquid LQ of the abovementioned embodiments is water, but it may be a liquid other than water. For example, if the light source of the exposure light EL is an $F_2$ laser, this $F_2$ laser light will not pass through water, so the liquid LQ may be, for example, a fluorocarbon fluid such as a perfluoropolyether (PFPE) or a fluorocarbon oil that an $F_2$ laser is able to pass through. In addition, it is also possible to use, as the liquid LQ, liquids that have transmittance with respect to the exposure light EL and whose refractive indices are as high as possible and that are stable with respect to the photoresist coated on the projection optical system PL and the surface of the substrate P (for example, cedar oil). Moreover as the liquid LQ, a liquid with a refractive index of 1.6 to 1.8 may be used. Furthermore, the optical element (such as the terminal optical element FL) of the projection optical system PL which is in contact with the liquid LQ may be formed from quartz (silica) or a single crystal material of a fluoride compound such as calcium fluoride (fluorite), barium fluoride, strontium fluoride, lithium fluoride, and sodium fluoride. A final optical element may be formed from a material with a refractive index that is higher than that of quartz or fluorite (for example 1.6 or more). As materials with a refractive index that is 1.6 or more, it is possible to use sapphire and germanium dioxide, etc., disclosed in PCT International Patent Publication No. WO 2005/059617, and potassium chloride (refractive index of approximately 1.75) disclosed in PCT International Patent Publication No. WO 2005/059618. Moreover, a thin film that has lyophilicity and/or a dissolution prevention mechanism may be formed on a portion of the surface of the final optical element (including at least the contact surface with the liquid) or all thereof. Note that silica has a high affinity with liquid, and a dissolution prevention mechanism is not required, but it is preferable to at least form a dissolution prevention film in the case of fluorite. For the liquid LQ, various liquids, for example a supercritical liquid, can be used. Here, a liquid with a refractive index that is higher than that of pure water (for example, 1.5 or higher) includes for example a predetermined liquid with a C—H bond and an O—H bond such as isopropanol with a refractive index of approximately 1.5 and glycerol (glycerine) with a refractive index of approximately 1.61; a predetermined liquid (organic solvent) such as hexane, heptane, decane; and Decalin (Decahydronaphthalene) with a refractive index of approximately 1.60. Alternatively, the liquid can be one that is a mixture of two or more types of optional liquids among these predetermined liquids, or one that is made by adding (mixing) at least one of these liquids to/with pure water. Alternatively, as the liquid, one in which an acid or a base such as $H^+$, $Cs^+$, and $K^+$, or $Cl^-$, $SO_4^{2-}$, and $PO_4^{2-}$ is added to (mixed with) pure water can be used, and a liquid in which fine particles of for example Al oxide are added to (mixed with) pure water can be used. Furthermore, the liquid is preferably one for which the light absorption coefficient is small, the temperature dependency is small, and which is stable with respect to the photosensitive material (or top coat film or anti-reflection film, etc.) painted on the surface of the projection optical system and/or the substrate. Furthermore, a top coat film and the like that protects the photosensitive material and substrate from the liquid can be provided on the substrate.

For the substrate P in each of the abovementioned embodiments, not only a semiconductor wafer for fabricating semiconductor devices can be used, but also, for example, a glass substrate for a display device, a ceramic wafer for a thin film magnetic head, or a mask or the original plate of a reticle (synthetic quartz, silicon wafer) used in an exposure apparatus, or a film member etc., can be used. Furthermore, the shape of the substrate is not limited to a circle, and may be another shape such as a rectangle.

The exposure apparatus EX can be applied to a step-and-repeat type projection exposure apparatus (stepper) that fully exposes the pattern of the mask M with the mask M and the substrate P in a stationary state, and successively moves the substrate P stepwise, in addition to a sand-scan type exposure apparatus (scanning stepper) that synchronously moves the mask M and the substrate P, and scan-exposes the pattern of the mask M.

Furthermore, the step-and-repeat type exposure may be such that a reduced image of a first pattern is transferred onto the substrate P using the projection optical system with the first pattern and the substrate P in a substantially stationary state, then the reduced image of a second pattern is partially superposed on the first pattern and fully transferred onto the substrate P using the projection optical system with the second pattern and the substrate P in a substantially stationary state (a stitch type fill exposure apparatus). In addition, the stitch type exposure apparatus can also be adapted to a step-and-stitch type exposure apparatus that partially and superposingly transfers at least two patterns onto the substrate P, and sequentially moves the substrate P.

Furthermore, the present invention can be applied to multistage type (twin stage type) exposure apparatuses provided with a plurality of substrate stages disclosed in Japanese Unexamined Patent Application, First Publication No. H10-163099, Japanese Unexamined Patent Application, First Publication No. H10-214783 (corresponding U.S. Pat. No. 6,341,007, No. 6,400,441, No. 6,549,269, and No. 6,590,634), and Published Japanese translation No. 2000-505958 of PCT International Publication (corresponding U.S. Pat. No. 5,969,441).

Moreover, as disclosed in PCT International Publication No. WO99/49504, the present invention can be applied to an exposure apparatus that is not provided with a measurement stage. Furthermore, it can be applied to an exposure apparatus provided with a plurality of substrate stages and measurement stages.

Moreover, the above embodiments employ the exposure apparatus in which liquid is locally filled between the projection optical system PL and the substrate P. However, the present invention can also be applied to liquid immersion exposure apparatuses, disclosed in Japanese Unexamined Patent Application, First Publication No. H06-124873, Japanese Unexamined Patent Application, First Publication No. H10-303114, and U.S. Pat. No. 5,825,043, that carry out exposure while the entire surface of the exposure target substrate is immersed.

In the abovementioned embodiments, an exposure apparatus furnished with a projection optical system PL was described as an example, however the present invention can also be applied to an exposure apparatus and an exposure method which does not use a projection optical system PL. Even in the case where a projection optical system PL is not used, the exposure light can be irradiated onto the substrate via an optical member such as a lens, and an immersion space can be formed in a predetermined space between such an optical member and the substrate.

The type of exposure apparatus EX is not limited to semiconductor device fabrication exposure apparatuses that expose the pattern of a semiconductor device on the substrate P, but can also be widely adapted to, for example, exposure apparatuses for fabricating liquid crystal display devices or displays, or exposure apparatuses for fabricating thin film magnetic heads, imaging devices (CCDs), micro machines, MEMS, DNA chips, and reticles or masks.

The embodiments discussed above use a light transmitting type mask, which forms a prescribed shielding pattern (or a phase pattern, or a dimming pattern) onto a substrate that has light transmitting characteristics. Instead of such a mask, for example, as disclosed in U.S. Pat. No. 6,778,257, an electronic mask (called a variable form mask, for example this includes a DMD (Digital Micro-mirror Device) as one type of non-radiative type image display element (also called a spatial light modulator (SLM)) may be used that forms a transmitted pattern, a reflected pattern, or a light emitting pattern, based on digital data of the pattern to be exposed. An exposure apparatus that uses a DMD is disclosed for example in U.S. Pat. No. 6,778,257.

Furthermore, the present invention can also be applied to an exposure apparatus (lithography system) which exposes a line-and-space pattern on a substrate P by forming interference fringes on the substrate P, as disclosed for example in PCT International Publication No. WO2001/035168.

Moreover, the present invention can also be applied to an exposure apparatus as disclosed for example in Published Japanese Translation No. 2004-519850 of PCT International Publication (corresponding U.S. Pat. No. 6,611,316), which combines patterns of two masks on a substrate via a projection optical system, and double exposes a single shot region on the substrate at substantially the same time, using a single scan exposure light. Moreover, the present invention can also be applied to a proximity type exposure apparatus, a mirror projection aligner, and the like.

As far as is permitted, the disclosures in all of the Japanese Patent Publications and U.S. patents related to exposure apparatuses and the like cited in the above respective embodiments and modified examples, are incorporated herein by reference.

As described above, the exposure apparatus EX of the above described embodiments is manufactured by assembling various subsystems, including each constituent element, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus from the various subsystems includes, for example, the mutual mechanical connection, the wiring and connection of electrical circuits, and the piping and connection of the atmospheric pressure circuit of the various subsystems. Of course, before the process of assembling the exposure apparatus from these various subsystems, there are also the processes of assembling each individual subsystem. When the process of assembling the exposure apparatus from the various subsystems is finished, a comprehensive adjustment is performed to ensure the various accuracies of the exposure apparatus as a whole. Furthermore, it is preferable to manufacture the exposure apparatus in a clean room wherein, for example, the temperature and the cleanliness level are controlled.

Figure 28:
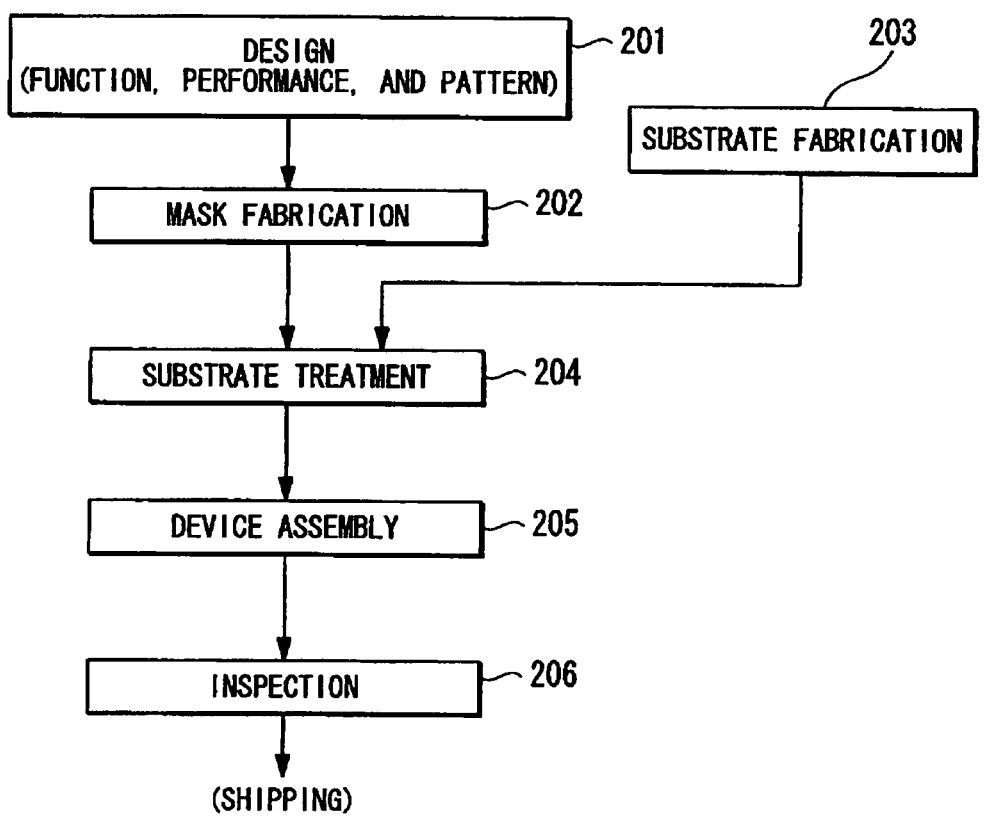
FIG. 28 is a flow chart diagram that depicts one example of a process of manufacturing a microdevice.

As shown in FIG. 28, a micro-device, such as a semiconductor device, is manufactured by, for example: a step 201 of designing the functions and performance of the micro-device; a step 202 of fabricating a mask (reticle) based on this design step; a step 203 of fabricating a substrate, which is the base material of the device; a substrate treatment step 204 that includes substrate treatment (exposure process) that exposes the pattern of the mask onto the substrate according to the embodiments discussed above, and develops the exposed substrate; a device assembling step 205 (comprising fabrication processes, such as a dicing process, a bonding process, and a packaging process); and an inspecting step 206.

What is claimed is:

1. A cleaning method of a liquid immersion exposure apparatus that exposes a substrate with exposure light, the method comprising:

holding a plate member by a holding section of a substrate stage that can hold the substrate;

during a cleaning operation, confining a liquid between a first member and the plate member, thereby a liquid immersion space being formed on a portion of an upper surface of the plate member, the surface area of the portion being less than the surface area of the upper surface;

after forming the immersion space, varying at least one of a supply rate and a recovery rate of the liquid during the cleaning operation, thereby varying a volume of the liquid confined between the first member and the plate member, such that an interface of the liquid between the first member and the portion of the upper surface of the plate member is moved back and forth, in order to remove a foreign substance from the first member; and unloading the plate member from the substrate stage.

2. The cleaning method according to claim 1, wherein the foreign substance that has been removed from the first member is held on the plate member and the plate member is removed from the substrate stage with the foreign substance held on the plate member.

3. The cleaning method according to claim 2, wherein the plate member has a holding region that is able to hold the foreign substance with electrostatic force, and a liquid repellent region formed so as to surround the holding region.

4. The method according to claim 3, wherein the liquid repellent region is in a same plane as the upper surface.

5. The method according to claim 1, wherein the plate member has an outer shape similar to the substrate.

6. The method according to claim 1, wherein the upper surface is configured to be electrically charged with a potential which is opposite to a zeta potential of the foreign substance.

7. The method according to claim 1, wherein the first member has a supply port to supply the liquid to the liquid immersion space.

8. The method according to claim 1, wherein the first member has a recovery port to recover the liquid from the liquid immersion space.

9. The method according to claim 8, wherein the plate member is placed such that the upper surface of the plate member is opposite to the recovery port.

10. A cleaning method of a liquid immersion exposure apparatus that exposes a substrate with exposure light, the method comprising:

holding a plate member by a holding section of a substrate stage that can hold the substrate;

during a cleaning operation, confining a liquid between a first member and the plate member, thereby a liquid immersion space being formed on a portion of an upper surface of the plate member, the surface area of the portion being less than the surface area of the upper surface;

after forming the immersion space, varying at least one of a supply rate and a recovery rate of the liquid during the cleaning operation, thereby varying a volume of the liquid confined between the first member and the plate member, such that vibrations of an interface of the liquid between the first member and the portion of the upper surface of the plate member are caused, in order to remove a foreign substance from the first member; and unloading the plate member from the substrate stage.

11. The method according to claim 10, wherein the foreign substance that has been removed from the first member is held on the plate member and the plate member is removed from the substrate stage with the foreign substance held on the plate member.

12. The method according to claim 10, wherein the plate member has a holding region that is able to hold the foreign substance with electrostatic force, and a liquid repellent region formed so as to surround the holding region.

13. The method according to claim 12, wherein the liquid repellent region is in a same plane as the upper surface.

14. The method according to claim 10, wherein the plate member has an outer shape similar to the substrate.

15. The method according to claim 10, wherein the upper surface of the plate member is configured to be electrically charged with a potential which is opposite to a zeta potential of the foreign substance.

16. The method according to claim 10, wherein the first member has a supply port to supply the liquid to the liquid immersion space.

17. The method according to claim 10, wherein the first member has a recovery port to recover the liquid from the liquid immersion space.

18. The method according to claim 17, wherein the plate member is placed such that the upper surface of the plate member is opposite to the recovery port.

* * * * *